US012727349B2

(12) United States Patent
Chi

(10) Patent No.: US 12,727,349 B2

(45) Date of Patent: Sep. 1, 2026

(54) DISPLAY PANEL, PIXEL REPAIR METHOD AND DISPLAY DEVICE

(71) Applicant: Hubei Yangtze Industrial Innovation Center of Advanced Display Co., LTD., Wuhan (CN)

(72) Inventor: Xiao Chi, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 344 days.

(21) Appl. No.: 18/623,478

(22) Filed: Apr. 1, 2024

(65) Prior Publication Data

US 2025/0221187 A1 Jul. 3, 2025

(30) Foreign Application Priority Data

Dec. 29, 2023 (CN) ......................... 202311869828.6

(51) Int. Cl.

*H10K 59/131* (2023.01)
*G09G 3/00* (2006.01)
*G09G 3/3233* (2016.01)
*H10K 59/12* (2023.01)
*H10K 59/17* (2023.01)

(52) U.S. Cl.

CPC ........... *H10K 59/131* (2023.02); *G09G 3/006* (2013.01); *G09G 3/3233* (2013.01); *H10K 59/1201* (2023.02); *G09G 2300/0413* (2013.01); *G09G 2300/0426* (2013.01); *G09G 2300/0842* (2013.01); *G09G 2300/0861* (2013.01); *G09G 2310/08* (2013.01); *G09G 2320/0233* (2013.01); *G09G 2330/10* (2013.01); *G09G 2330/12* (2013.01)

(58) Field of Classification Search

CPC .. H10K 59/131; H10K 59/1201; G09G 3/006; G09G 3/3233; G09G 2300/0413; G09G 2300/0426; G09G 2300/0842; G09G 2300/0861; G09G 2310/08; G09G 2320/0233; G09G 2330/10; G09G 2330/12; G09G 3/3208; G09G 2310/0243; G09G 2310/0264; G09G 2320/0271; G09G 2330/08

See application file for complete search history.

(56) References Cited

U.S. PATENT DOCUMENTS 9,911,799 B2 * 3/2018 Cho .................... H10D 86/423
2010/0265424 A1 * 10/2010 Chiu ................ G02F 1/136259 349/54
2016/0335955 A1 * 11/2016 Cho .................... G09G 3/3233
2017/0123284 A1 * 5/2017 Lee .................. G02F 1/134336
2022/0246711 A1 * 8/2022 Zhang ................. H10K 59/131

* cited by examiner

*Primary Examiner* — Tuyen K Vo

(74) *Attorney, Agent, or Firm* — Anova Law Group, PLLC

(57) ABSTRACT

A display panel, a pixel repair method of a display panel and a display device are provided. The display panel includes a plurality of light-emitting elements, a plurality of pixel driving circuit rows, a plurality of repair connection lines, a plurality of repair data lines, a plurality of repair driving circuits, an active layer and a first adapting structure. The plurality of repair driving circuits are arranged along the second direction, and a repair driving circuit is correspondingly provided with at least two repair data lines. In a direction perpendicular to the plane of the substrate of the display panel, the first adapting structure at least partially overlaps the two repair data lines.

22 Claims, 30 Drawing Sheets

MC

DISPLAY PANEL, PIXEL REPAIR METHOD AND DISPLAY DEVICE

CROSS-REFERENCE TO RELATED APPLICATION

This application claims the priority of Chinese Patent Application No. 202311869828.6, filed on Jan. 4, 2024, the content of which is incorporated by reference in its entirety.

TECHNICAL FIELD

The present disclosure generally relates to the field of display technologies and, more particularly, relates to a display panel, a method of repairing the pixel of the display panel and a display device.

BACKGROUND

Organic light-emitting diode (OLED) is a device that uses a multi-layer organic thin-film structure to produce electroluminescence. It is easy to make and only requires a low driving voltage. OLED displays are thinner and lighter than traditional LCD displays, have high brightness, low power consumption, fast response, high definition, good flexibility and high light-emitting efficiency, and can meet consumers' new needs for display technology. A pixel circuit needs to be set up in the display panel to drive the OLED device to emit light. If the pixel circuit is defective, the corresponding OLED device cannot display the correct brightness, causing display defects in the display panel and affecting the display effect.

The present disclosed display panels, methods for repairing the pixel and display devices are direct to solve one or more problems set forth above and other problems in the arts.

SUMMARY

One aspect of the present disclosure provides a display panel. The display panel includes a substrate; a display area and a non-display area at least partially surrounding the display area; and a plurality of light-emitting elements and a plurality of pixel driving circuit rows. The display area includes the plurality of light-emitting elements and the plurality of pixel driving circuit rows, the plurality of pixel driving circuit rows include a plurality of pixel driving circuits arranged in a first direction; and one of the plurality of pixel driving circuits is electrically connected to at least one light-emitting element of the plurality of light-emitting elements. The display panel may also include a plurality of repair connection lines, a plurality of repair data lines and a plurality of repair driving circuits. One of the plurality of pixel driving circuit rows is correspondingly provided with at least one of the plurality of repair driving circuits and at least one of the plurality of repair connection lines, in a direction perpendicular to a plane of the substrate, the pixel driving circuit row and the repair driving circuit at least partially overlap with a same repair connection line of the plurality of repair connection lines. Further, the display panel includes an active layer and a first adapting structure. The first adapting structure is located on a side of the active layer away from the substrate, the repair driving circuit includes a data writing transistor, the data writing transistor includes a channel and a first electrode located in the active layer, and the first adapting structure is electrically connected to the first electrode of the data writing transistor.

Further, the display panel includes a plurality of the repair driving circuits arranged in a second direction. One repair driving circuit of the plurality of driving circuits is correspondingly provided with at least two repair data lines of the plurality of repair data lines, the second direction intersects the first direction, in the direction perpendicular to the plane of the substrate, the first adapting structure at least partially overlaps with two repair data lines of the plurality of repair date lines.

Another aspect of the present disclosure provides a pixel repair method for a display panel. The pixel repair method may include providing a display panel. The display panel includes a substrate; a display area and a non-display area at least partially surrounding the display area; and a plurality of light-emitting elements and a plurality of pixel driving circuit rows. The display area includes the plurality of light-emitting elements and the plurality of pixel driving circuit rows, the plurality of pixel driving circuit rows include a plurality of pixel driving circuits arranged in a first direction; and one of the plurality of pixel driving circuits is electrically connected to at least one light-emitting element of the plurality of light-emitting elements. The display panel may also include a plurality of repair connection lines, a plurality of repair data lines and a plurality of repair driving circuits. One of the plurality of pixel driving circuit rows is correspondingly provided with at least one of the plurality of repair driving circuits and at least one of the plurality of repair connection lines, in a direction perpendicular to a plane of the substrate, the pixel driving circuit row and the repair driving circuit at least partially overlap with a same repair connection line of the plurality of repair connection lines. Further, the display panel includes an active layer and a first adapting structure. The first adapting structure is located on a side of the active layer away from the substrate, the repair driving circuit includes a data writing transistor, the data writing transistor includes a channel and a first electrode located in the active layer, and the first adapting structure is electrically connected to the first electrode of the data writing transistor. Further, the display panel includes a plurality of the repair driving circuits arranged in a second direction. One repair driving circuit of the plurality of driving circuits is correspondingly provided with at least two repair data lines of the plurality of repair data lines, the second direction intersects the first direction, in the direction perpendicular to the plane of the substrate, the first adapting structure at least partially overlaps with two repair data lines of the plurality of repair date lines. Further, the pixel repair method may include determining a defective pixel; disconnecting an electrical connection between a light-emitting element of the defective pixel and a corresponding pixel driving circuit; and electrically connecting the light-emitting element of the defective pixel with a corresponding repair connection line.

Another aspect of the present disclosure includes providing a display device. The display device includes a display panel. The display panel includes a substrate; a display area and a non-display area at least partially surrounding the display area; and a plurality of light-emitting elements and a plurality of pixel driving circuit rows. The display area includes the plurality of light-emitting elements and the plurality of pixel driving circuit rows, the plurality of pixel driving circuit rows include a plurality of pixel driving circuits arranged in a first direction; and one of the plurality of pixel driving circuits is electrically connected to at least one light-emitting element of the plurality of light-emitting elements. The display panel may also include a plurality of repair connection lines, a plurality of repair data lines and a plurality of repair driving circuits. One of the plurality of pixel driving circuit rows is correspondingly provided with at least one of the plurality of repair driving circuits and at least one of the plurality of repair connection lines, in a direction perpendicular to a plane of the substrate, the pixel driving circuit row and the repair driving circuit at least partially overlap with a same repair connection line of the plurality of repair connection lines. Further, the display panel includes an active layer and a first adapting structure. The first adapting structure is located on a side of the active layer away from the substrate, the repair driving circuit includes a data writing transistor, the data writing transistor includes a channel and a first electrode located in the active layer, and the first adapting structure is electrically connected to the first electrode of the data writing transistor. Further, the display panel includes a plurality of the repair driving circuits arranged in a second direction. One repair driving circuit of the plurality of driving circuits is correspondingly provided with at least two repair data lines of the plurality of repair data lines, the second direction intersects the first direction, in the direction perpendicular to the plane of the substrate, the first adapting structure at least partially overlaps with two repair data lines of the plurality of repair date lines.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

To more clearly understand the above objects, features and advantages of the embodiments of the present disclosure, the solutions of the embodiments of the present disclosure will be further described below. It should be noted that, as long as there is no conflict, the embodiments of the present disclosure and the features in the embodiments can be combined with each other.

Many specific details are set forth in the following description to fully understand the embodiments of the present disclosure, but the embodiments of the present disclosure can also be implemented in other ways different from those described here; obviously, the embodiments in the description are only some embodiments of the present disclosure, not all embodiments.

Figure 1:
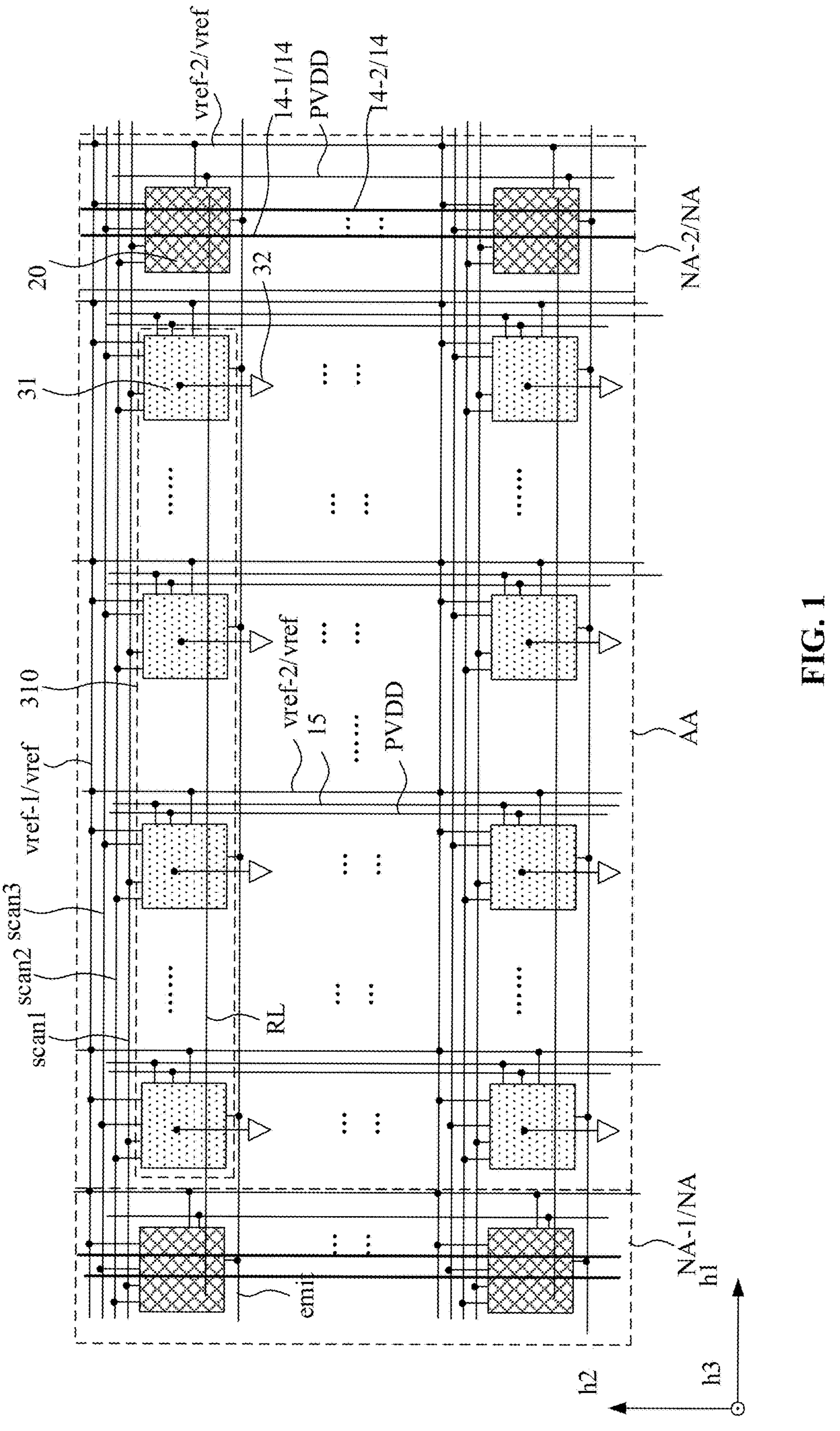
FIG. 1 illustrates a portion of an exemplary display panel according to various disclosed embodiments of the present disclosure.

The present disclosure provides a display panel. FIG. 1 illustrates an exemplary display panel according to various disclosed embodiments of the present disclosure. As shown in FIG. 1, the display panel may include a substrate, a display area AA, and a non-display area NA. The display area AA may include a plurality of pixel driving circuit rows 310 and a plurality of light-emitting elements 32. The pixel driving circuit row 310 may include a plurality of pixel driving circuits 31 arranged in a first direction h1, and one pixel driving circuit 31 may be electrically connected to at least one light-emitting element 32. The display panel may also include a plurality of repair driving circuits 20 and a plurality of repairing connection lines RL.

Specifically, as shown in FIG. 1, the display panel may also include a plurality of signal lines, including a first scan line scan1, a second scan line scan2, a third scan line scan3, a horizontal reset voltage line vref-1, a vertical reset voltage line vref-2, a light-emitting control line emit, a pixel data line 15 and a power supply voltage line PVDD. Each pixel driving circuit 31 may be connected to the first scan line scan1, the second scan line scan2, the third scan line scan3, the lateral reset voltage line vref-1, the light-emitting control line emit, the pixel data line 15, and the power supply voltage line PVDD to drive the corresponding light-emitting element 32 to emit light.

In FIG. 1, one pixel driving circuit 31 and one repairing driving circuit 20 may also be connected to the vertical reset voltage line vref-2, and the vertical reset voltage line vref-2 may be electrically connected to the horizontal reset voltage line vref-1 to form a grid optimizing design, thereby reducing the loading difference of each pixel in the display panel. Therefore, in an actual display panel, not all pixel driving circuit 31 and the repair driving circuit 20 need to be directly connected to the vertical reset voltage line vref-2. FIG. 1 is only an illustration, the connection relationship between the repair driving circuit 20 and the vertical reset voltage line vref-2 in the following embodiments may be same and will not be described again.

It should be noted that in an actual display panel, the pixel driving circuit 31 may be configured to implement a variety of driving methods, which requires a variety of settings for the number and type of signal lines (for example, only two scanning lines are set). Therefore, one pixel driving circuit row 310 may also be arranged corresponding to other signal lines. FIG. 1 is only an illustration and does not limit the arrangement of signal lines in the actual display panel.

The display panel may also include the repair driving circuit 20 and the repair connection line RL. The repair connection line RL may extend along the first direction h1 and in the direction h3 perpendicular to the plane of the substrate, the repair driving circuit 20 may at least partially overlap with the repair connection line RL.

Specifically, when the pixel driving circuit 31 operates normally, the corresponding repair connection lines RL may only overlap in the direction h3 perpendicular to the plane of the substrate, but may not be directly electrically connected. It should be noted that, to facilitate the subsequent repair of defective pixels appearing in the display area of the display panel, it may be preferable to arrange the connection structure between the pixel driving circuit 31 and the light-emitting element 32 and the repair connection line RL 32 at least partially overlap in the thickness direction of the display panel. The connection structure between the pixel driving circuit 31 and the light-emitting element 32 may be referred to as a adapting structure that is electrically connected to both the transistors in the pixel driving circuit 31 and the light-emitting element 32.

It should be noted that the defective pixel in the present disclosure may refer to the fact that the light-emitting element electrically connected to the pixel driving circuit cannot display the correct brightness (that is, it cannot emit light normally). For example, under the same grayscale voltage, the defective pixel may be brighter than other normal pixels (bright spots) or darker than other normal pixels (dark spots), or defective pixels cannot be lit (dead pixels).

Each repair driving circuit 20 may be connected to the first scan line scan1, the second scan line scan2, the third scan line scan3, the lateral reset voltage line vref-1, the light-emitting control line emit and the power supply voltage line PVDD and may be configured to drive the corresponding light-emitting element 32 to emit light. The display panel may also include a plurality of repair data lines 14, and as shown in FIG. 1, a plurality of repair driving circuits 20 may be arranged in the second direction h2, and one repair driving circuit 20 may be provided with at least two repair data lines 14 correspondingly.

It should be noted that the repair driving circuit 20 and the repair data line 14 may be arranged correspondingly. The adapting structure in the repair driving circuit 20 that is electrically connected to the data writing transistor and the repair data line 14 may at least partially overlap in the h3 direction. In some embodiments, the data writing transistor in the repair driving circuit 20 may be electrically connected to the repair data line 14 through the adapting structure.

It can be understood that, as shown in FIG. 1, the repair driving circuit 20 and the pixel driving circuit 31 in the corresponding pixel driving circuit row 310 may be connected to the same first scan line scan1, second scan line scan2, third scan line scan3, the lateral reset voltage line vref-1 and the light-emitting control line emit, therefore, the repair driving circuit 20 may directly use the scanning signal, reset signal and control signal of the defective pixel to drive the corresponding light-emitting element 32 to emit light.

Figure 2:
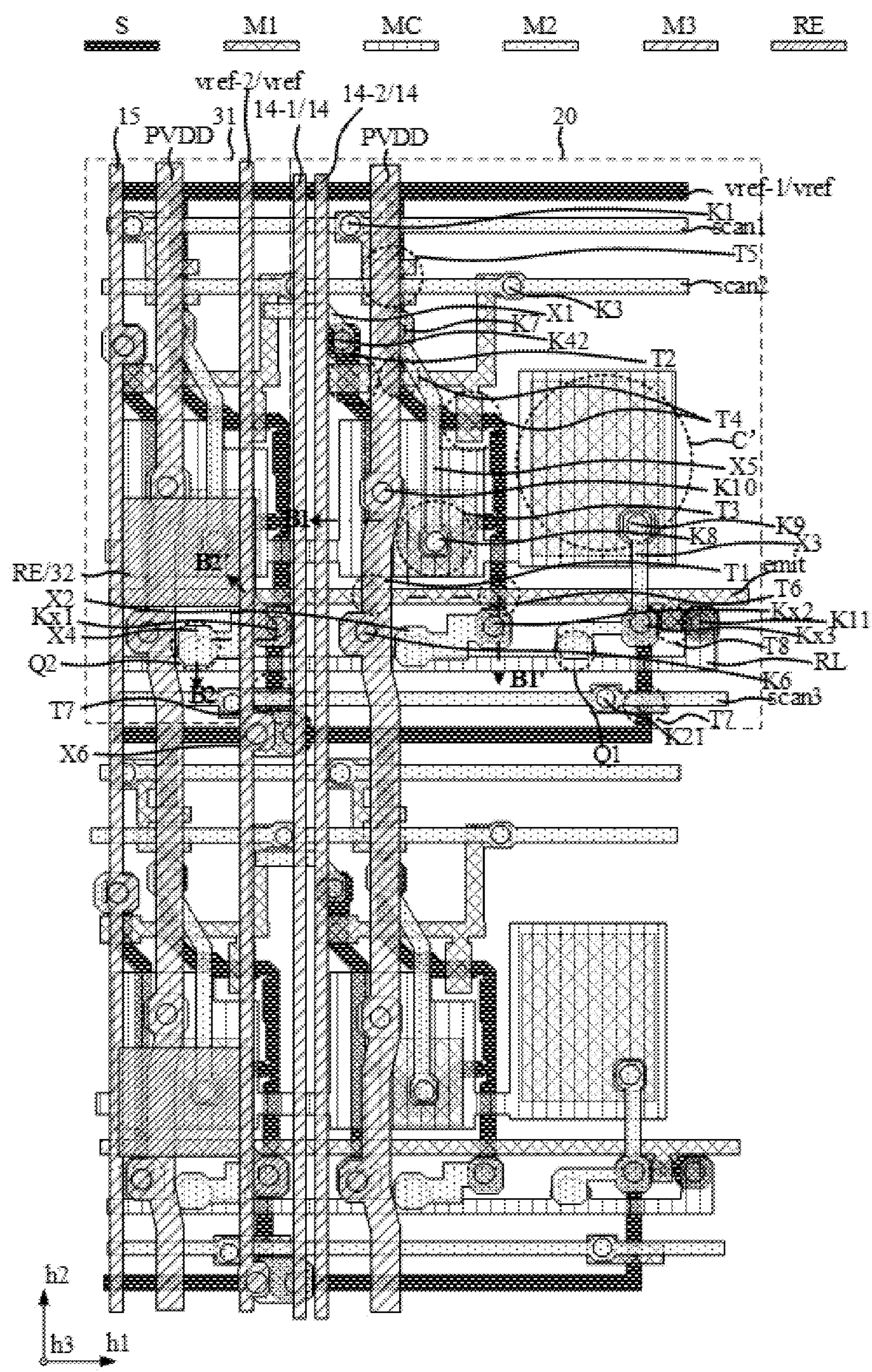
FIG. 2 illustrates a portion of a wiring layout of an exemplary display panel according to various disclosed embodiments of the present disclosure.
Figure 3:
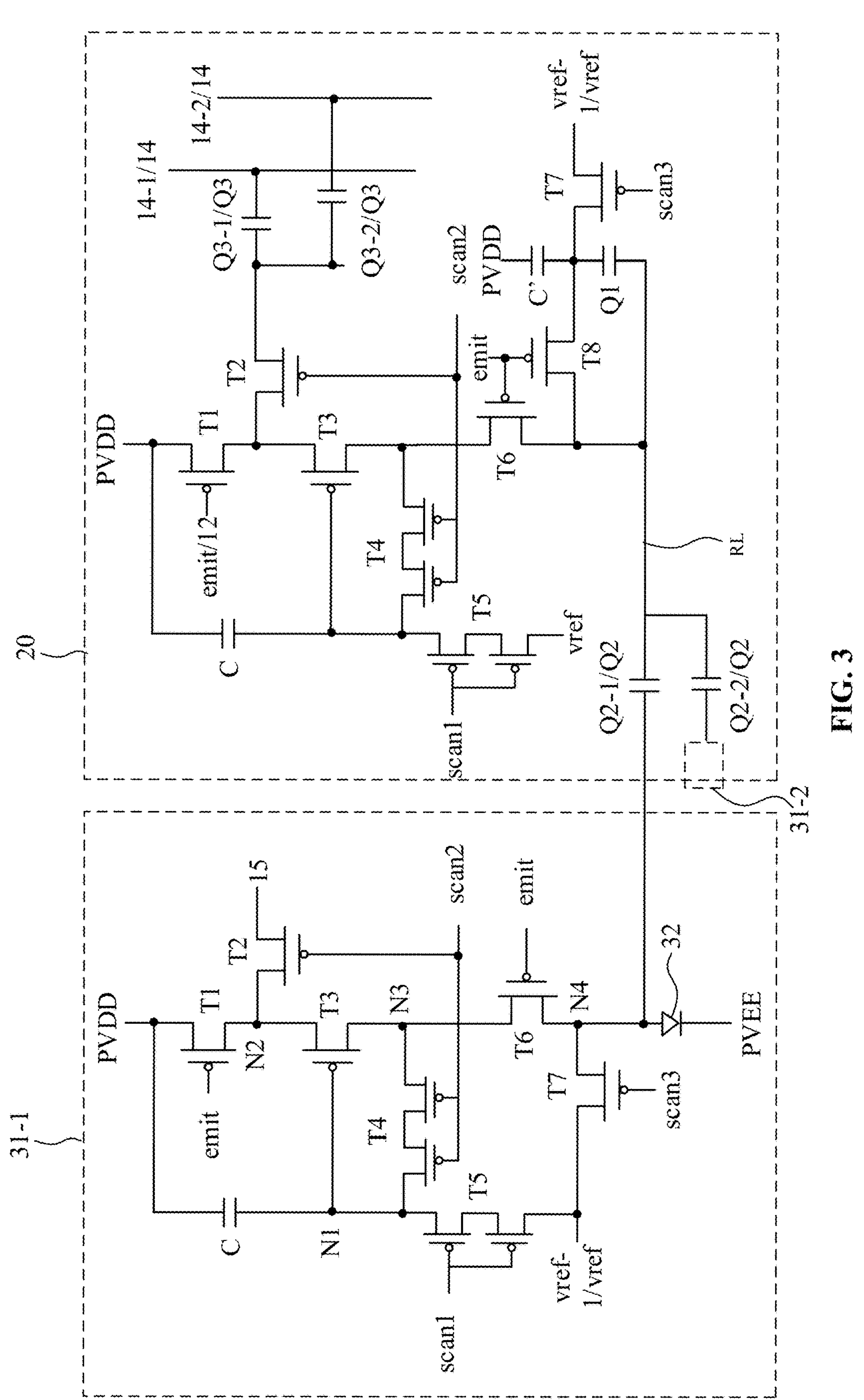
FIG. 3 illustrates a circuit mechanism of an exemplary display panel according to various disclosed embodiments of the present disclosure.
Figure 4:
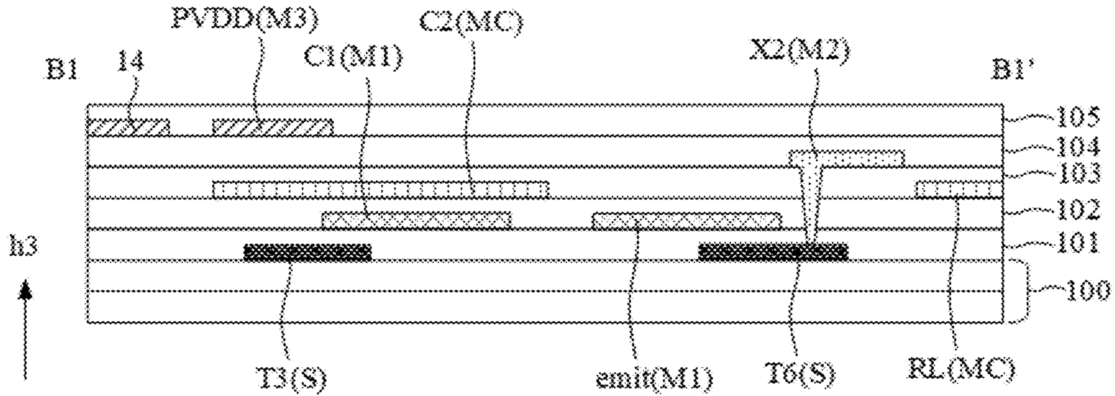
FIG. 4 illustrates a portion of a cross-sectional view of an exemplary display panel according to various disclosed embodiments of the present disclosure.

The present disclosure provides a specific embodiment to illustrate the basic principles of the above-mentioned display panel, as shown in FIGS. 2-4. FIG. 2 shows a portion of the layout structure of the display panel. FIG. 3 is a circuit mechanism corresponding to the layout structure of FIG. 2. FIG. 4 shows a portion of the B1-B1'-sectional view of the display panel in FIG. 2.

As shown in FIGS. 2-4, the pixel driving circuit 31 and the repair driving circuit 20 may both include a plurality of transistors T1 to T7 and a first storage capacitor C. Further, the repair driving circuit 20 may also include a transistor T8 and a second storage capacitor C'. The display panel may include a substrate 100 and a driving circuit layer. The above-mentioned pixel driving circuit 31 and the above-mentioned repair driving circuit 20 may all be located in the driving circuit layer, and the above-mentioned light-emitting element may be located on the side of the driving circuit layer away from the substrate 100. The driving circuit layer may specifically include an active layer S, a first insulation layer 101, a first metal layer M1, a second insulation layer 102, a capacitor metal layer MC, a third insulation layer 103, a second metal layer M2, and a fourth insulation layer 104, a third metal layer M3 and a fifth insulation layer 105 stacked in sequence. The first metal layer M1, the capacitor metal layer MC, the second metal layer M2 and the third metal layer M3 may be collectively referred to as wiring metal layers for layout signal lines or adapting structures. The active layer S may be located on one side of the substrate 100, the first insulation layer 101 may be located on the side of the active layer S away from the substrate 100, and the first metal layer M1 may be located on the side of the first insulation layer 101 away from the active layer S. The second insulation layer 102 may be located on the side of the first metal layer M1 away from the active layer S. The capacitive metal layer MC may be located on the side of the second insulation layer 102 away from the first metal layer M1. The third insulation layer 103 may be located on the side of the capacitive metal layer MC away from the second insulation layer 102. The second metal layer M2 may be located on the side of the third insulation layer 103 away from the capacitor metal layer MC. The fourth insulation layer 104 may be located on the side of the second metal layer M2 away from the third insulation layer 103. The third metal layer M3 may be located on the side of the fourth insulation layer 104 away from the second metal layer M2. The fifth insulation layer 105 may be located on the side of the third metal layer M3 away from the fourth insulation layer 104.

Figure 5:
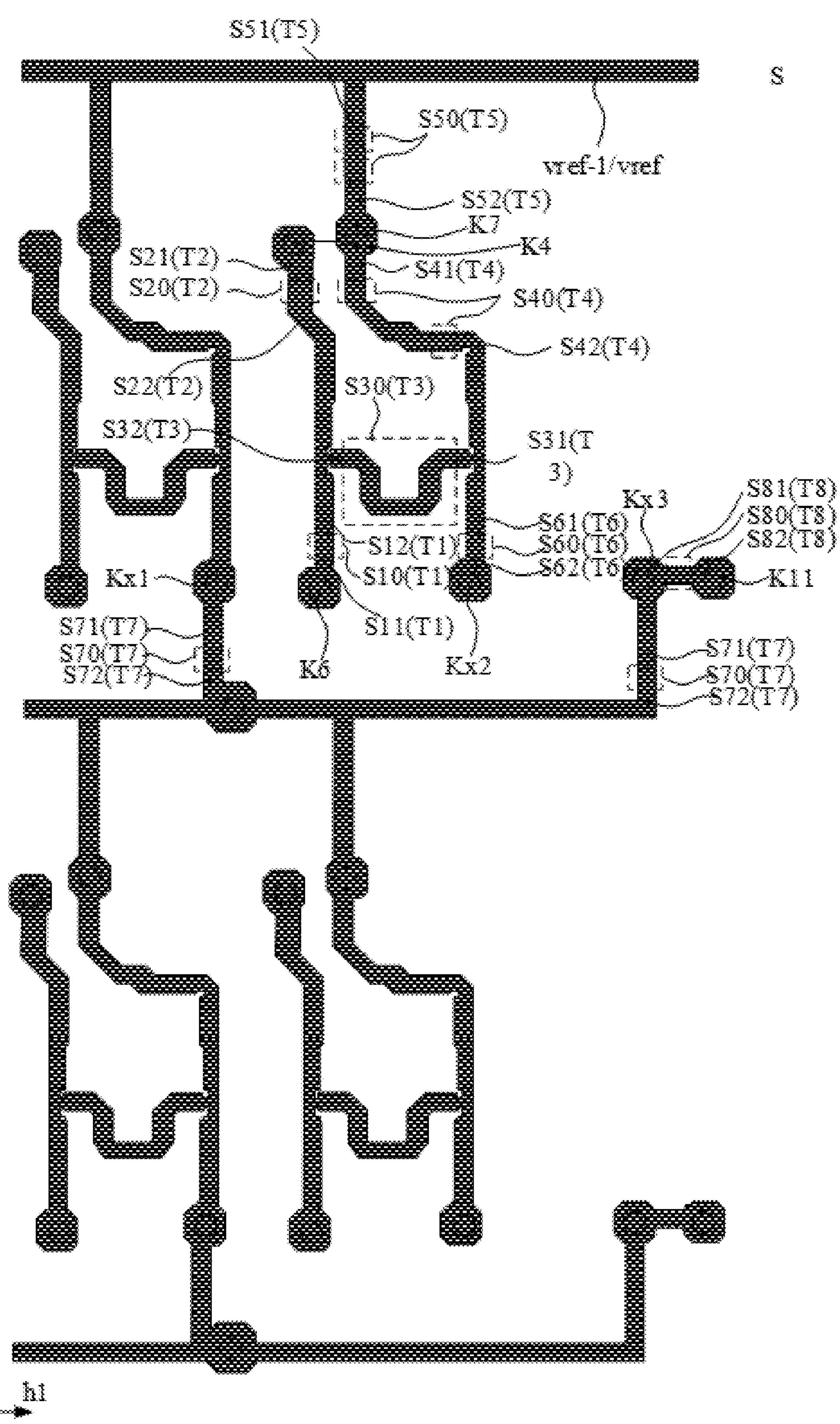
FIG. 5 illustrates an active layer of an exemplary display panel according to various disclosed embodiments of the present disclosure.

FIG. 5 is a schematic top view of an exemplary active layer according to various embodiments of the present disclosure. As shown in FIG. 2, FIG. 4 and FIG. 5, the active layer S may include a first channel region S10, a first doped region S11 and a second doped region S12 located at both sides of the channel region S10, a second channel region S20, a third doped region S21 and a fourth doped region S22 located on both sides of the second channel region S2, a third channel region S30, a fifth doped region S301 and a sixth doped region S302 located on both sides of the third channel region S300, two fourth channel regions S40, a seventh doped region S41 and an eighth doped region S42 on both sides of the two fourth channel region S40 (and the doped region between the two fourth channel regions S40), two fifth channel regions S50, and a ninth doped region S51 and a tenth doped region S52 on both sides of the fifth channel region S50 (as well as the doped region between the two fifth channel regions S50), a sixth channel region S60, an eleventh doped region S61 and a twelfth doped region S62 on both sides of the sixth channel region S60, a seventh channel region S70, a thirteenth doped region S71 and a fourteenth doped region S72 located on both sides of the seventh channel region S70, an eighth channel region S80, and a fifteenth doped region S81 and a sixteenth doped region S82 located on both sides of the ninth channel region S80. One of the two doped regions located on both sides of each channel region may be the source region, and the other may be the drain region. The source and drain regions may be doped with impurities. The impurities may include P-type impurities or N-type impurities. In one embodiment, the active layer S may include any one or more of low-temperature polysilicon, amorphous silicon, and oxide active layers.

As shown in FIG. 2 and FIG. 5, the active layer S may also include a lateral reset voltage line vref-1. The lateral reset voltage line vref-1 may be connected to the ninth doped region S51 and the fourteenth doped region S72 respectively. Such an arrangement may be equivalent to arranging the lateral reset voltage line vref-1 on the active layer S. In this way, it may avoid occupying the space of the wiring metal layer on the side of the active layer S away from the substrate such that the wiring metal layer above may have a sufficient space for routing other signal lines or structures.

Figure 6:
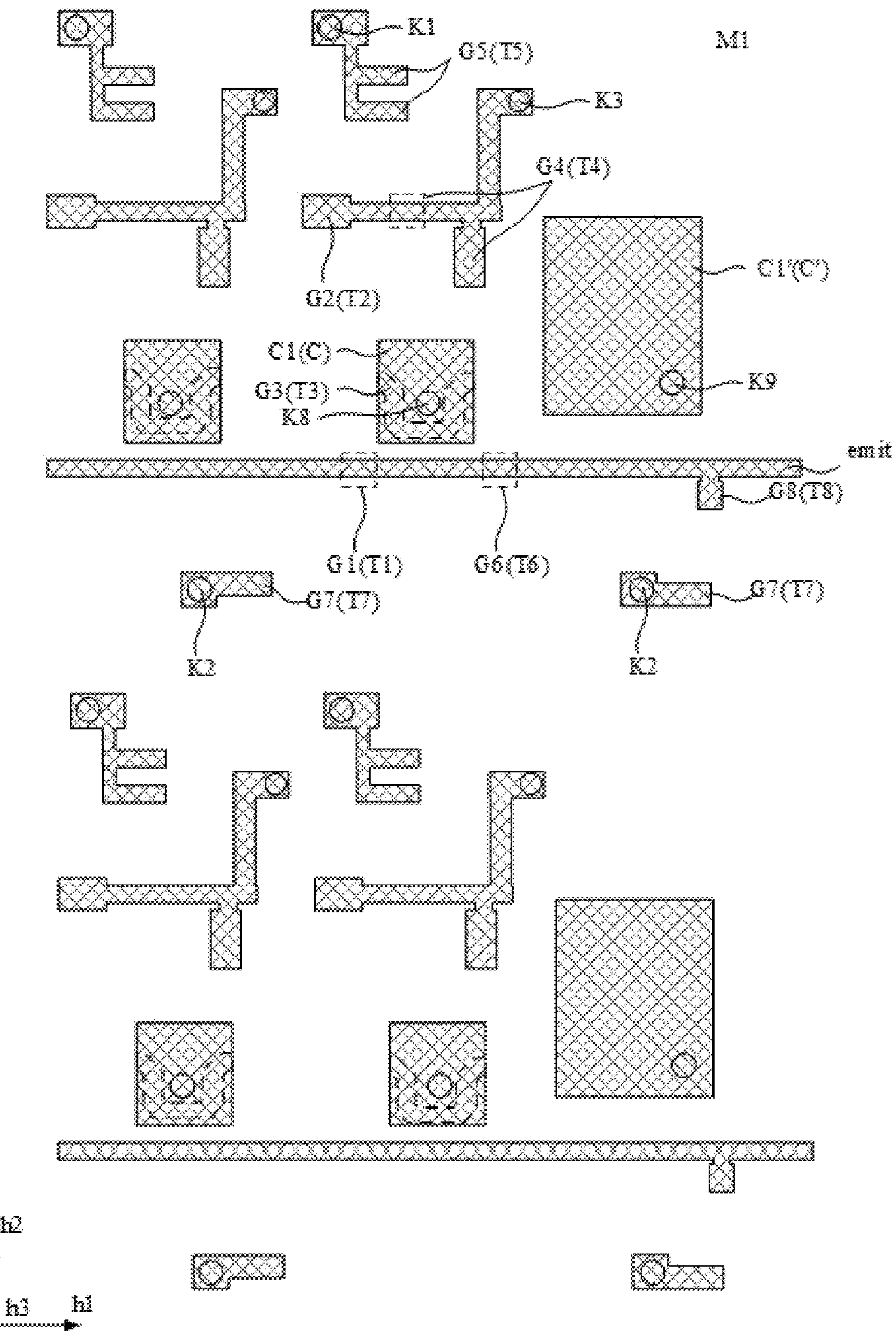
FIG. 6 illustrates a first metal layer of an exemplary display panel according to various disclosed embodiments of the present disclosure.

FIG. 6 is a schematic top view of an exemplary first metal layer M1 according to various disclosed embodiments of the present disclosure. As shown in FIG. 2 and FIG. 6, the first metal layer M1 may include the above-mentioned light-emitting control line emit, the first electrode C1 of the first storage capacitor C, the first electrode C1' of the second storage capacitor C', the gate G2 of the data writing transistor T2, the gate G4 of the threshold compensation transistor T4, the gate G5 of the first reset transistor T5, and the gate G7 of the second reset transistor T7. The gate G2 of the data writing transistor T2 and the gate G4 of the threshold compensation transistor T4 may be electrically connected.

As shown in FIGS. 5-6, in the thickness direction h3 of the display panel, the gate G2 of the data writing transistor T2 may overlap with the second channel region S20. The gate G4 of the threshold compensation transistor T4 may overlap with the above-mentioned fourth channel region S40. The gate G5 of the first reset transistor T5 may overlap with the fifth channel region S50. The gate G7 of the second reset transistor T7 may overlap with the above-mentioned seventh channel region S70. The overlapping portions of the light-emitting control line emit and the above-mentioned first channel region S10, the sixth channel region S60 and eighth channel region S80 may respectively form the gate G1 of the first light-emitting control transistor T1, the gate G6 of the second light-emitting control transistor T6, and the gate G8 of the repair control transistor T8. The portion of the first electrode C1 of the first storage capacitor C that overlaps with the third channel region S30 may correspond to the gate G3 of the driving transistor T3.

Figure 7:
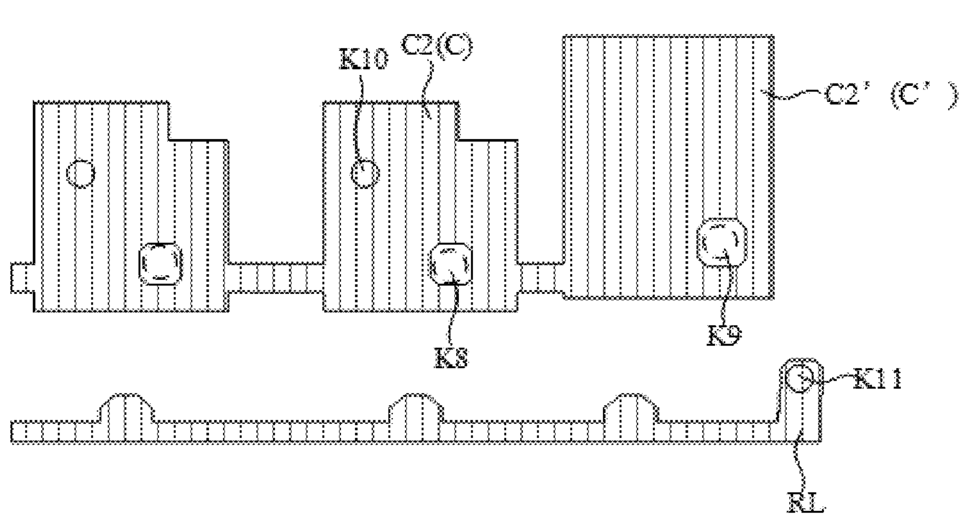
FIG. 7 illustrates a capacitor metal structure of an exemplary display panel according to various disclosed embodiments of the present disclosure.
Figure 7:
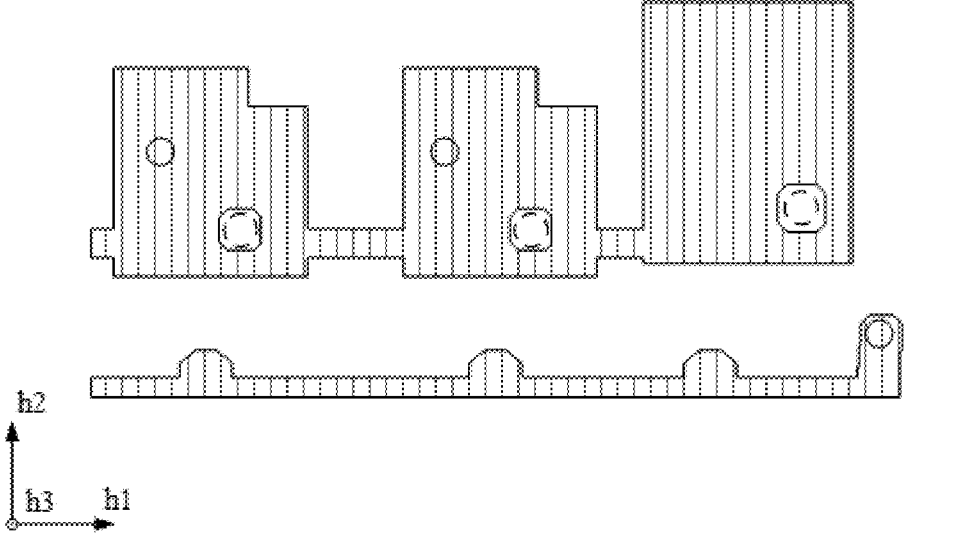

FIG. 7 is a schematic top view of an exemplary capacitor metal layer according to various disclosed embodiments of the present disclosure. As shown in FIG. 2 and FIG. 7, the capacitor metal layer MC may include a second electrode C2 of a first storage capacitor C, the second electrode C2' of the second storage capacitor C', and the above-mentioned repair connection line RL.

Figure 8:
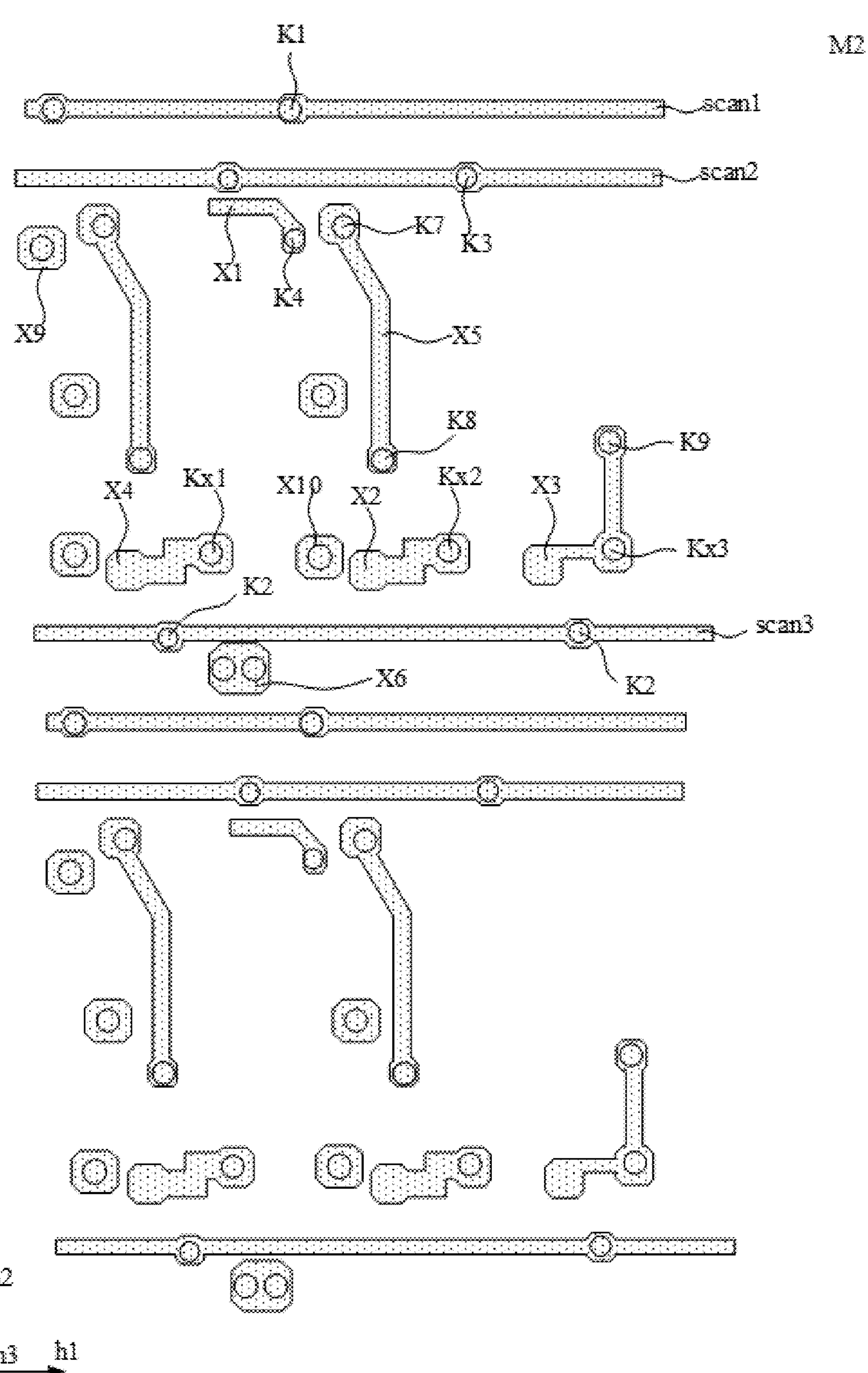
FIG. 8 illustrates a second metal layer of an exemplary display panel according to various disclosed embodiments of the present disclosure.

FIG. 8 is a schematic top view of an exemplary second metal layer according to various disclosed embodiments of the present disclosure. As shown in FIG. 2 and FIG. 8, the second metal layer M2 may include a first scan line scan1, a second scan line scan2, a third scan line scan3, a first adapting structure X1, a second adapting structure X2, a third adapting structure X3, a fourth adapting structure X4, a fifth adapting structure X5, a sixth adapting structure X6, a ninth adapting structure X9 and a tenth adapting structure X10.

As shown in FIG. 2, FIG. 5 and FIG. 8, the first scan line scan1 may be electrically connected to the gate G5 of the first reset transistor T5 located in the first metal layer M1 through the first via K1. The second scan line scan2 may be electrically connected to the gate G4 of the threshold compensation transistor T4 and the gate G2 of the data writing transistor T2 located in the first metal layer M1 through the third via K3. The third scan line scan3 may be electrically connected to the gate G7 of the second reset transistor T7 located in the first metal layer M1 through the second via K2.

Figure 9:
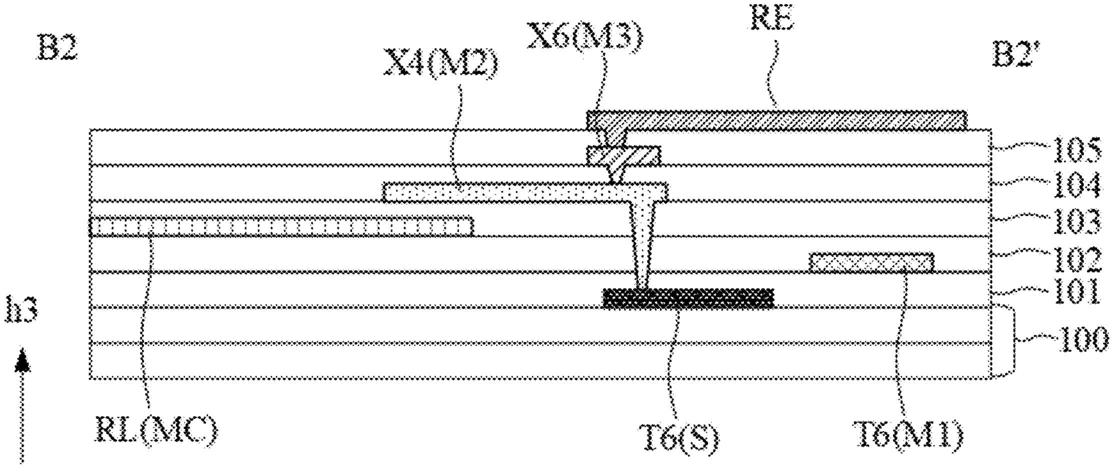
FIG. 9 illustrates a portion of a cross-sectional view of another exemplary display panel according to various disclosed embodiments of the present disclosure.

As shown in FIG. 2, FIG. 5, FIG. 7 and FIG. 8, the fourth adapting structure X4 may be electrically connected to the twelfth doped region S62 of the second light-emitting control transistor T6 of the driving transistor located in the active layer S through a first adapting via Kx1. Further, as shown in FIG. 9 (FIG. 9 shows a portion of the B2B2'-sectional view of the display panel in FIG. 2), the fourth adapting structure X4 may simultaneously at least partially overlap with the repair connection lines RL located in the capacitor metal layer MC RL in the direction h3 perpendicular to the plane where the substrate is located, and may form a second parasitic capacitor Q2.

As shown in FIG. 2, FIG. 5, FIG. 7 and FIG. 8, the second adapting structure X2 may be electrically connected to the twelfth doped region S62 of the second light-emitting control transistor T6 located in the active layer S through the second adapting via Kx2 and, at the same time may at least partially overlap with the repair connection line RL located on the capacitor metal layer MC in the direction h3 perpendicular to the plane of the substrate. In one embodiment, the second adapting structure X2 may be electrically connected to the repair connection line RL located on the capacitor metal layer MC through a via hole.

As shown in FIG. 2, FIG. 5, FIG. 7 and FIG. 8, the third adapting structure X3 may be electrically connected to the fifth doped region S81 of the repair control transistor T8 located in the active layer S through a third via K3. The third transfer structure X3 may at least partially overlap with the repair connection line RL located on the capacitor metal layer MC in a direction h3 perpendicular to the plane of the substrate.

As shown in FIG. 2, FIG. 6 and FIG. 8, the third adapting structure X3 may be electrically connected to the first electrode C1' of the second storage capacitor C' of the repair driving circuit located in the first metal layer M1.

As shown in FIG. 2, FIG. 5, FIG. 6 and FIG. 8, the fifth adapting structure X5 may be electrically connected to the tenth doping region S52 of the first reset transistor T5 and the seventh doped region S41 of the threshold compensation transistor T4 located in the active layer S through the seventh via K7. The fifth adapting structure X5 may also be electrically connected to the first electrode C1 of the first storage capacitor C in the first metal layer M1 through the eighth via K8.

Figure 10:
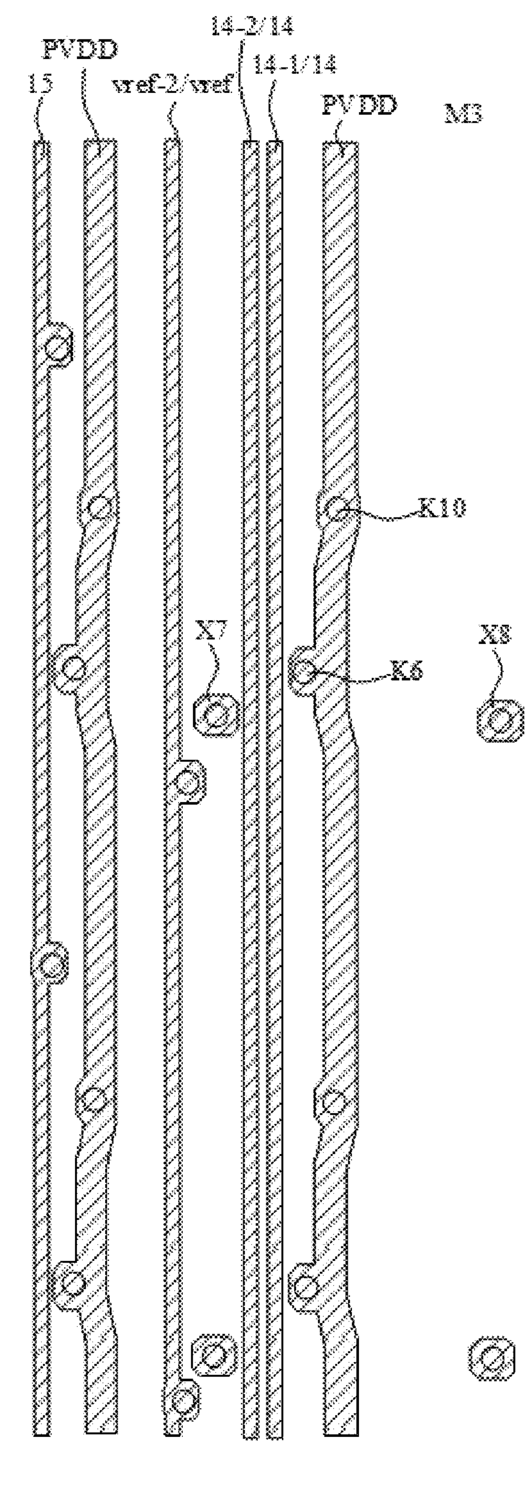
FIG. 10 illustrates a third metal layer of an exemplary display panel according to various disclosed embodiments of the present disclosure.

FIG. 10 is a schematic top view of an exemplary third metal layer according to various disclosed embodiments of the present disclosure. As shown in FIG. 2 and FIG. 10, the third metal layer M3 may include a pixel data line 15, a plurality of repair data lines 14, a vertical reset voltage line vref-2, a power supply voltage line PVDD, the seventh adapting structure X7 and the eighth adapting structure X8. The vertical reset voltage line vref-2 may be electrically connected to the above-mentioned horizontal reset voltage line vref-1.

As shown in FIG. 2, FIG. 8, FIG. 9 and FIG. 10, the display panel may also include an anode metal layer RE. The anode metal layer RE may be located on the side of the driving circuit layer away from the substrate 100. The anode of the above-mentioned light-emitting element may be located on the anode metal layer RE. The anode of the light-emitting element may be electrically connected to the active layer S through the seventh adapting structure X7 and the fourth adapting structure X4, thereby preventing the anode metal layer RE from being directly electrically connected to the active layer S through a deeper hole. That is to say, using the second metal layer M2 and the third metal layer M3 to act as an adapting structure and flexibly setting corresponding via holes may avoid occupying the display area of pixels, help to increase the aperture ratio and improve the display brightness. It should be noted that the eighth adapting structure X8 may be electrically connected to the second adapting structure X2. The arrangement of the eighth adapting structure X8 may make the etching effect at the edge position and the middle position in the display area AA more consistent, and thus improve the display uniformity of the display panel. It can be understood that in some embodiments, the display panel may not include the eighth adapting structure.

As shown in FIG. 2, FIG. 5 and FIG. 10, the pixel data line 15 may be electrically connected to the ninth adapting structure X9 located in the second metal layer M2 through the via hole. The ninth adapting structure X9 may be electrically connected to the third doped region scan21 of the data writing transistor T2 of the pixel driving circuit 31 located in the active layer S through the via hole, thereby realizing the pixel data line 15 located in the third metal layer M3 and the data writing transistor T2 of the pixel driving located in the active layer S to be electrically connected through the ninth adapting structure X9 to transmit the data voltage to the source or drain of the data writing transistor T2.

As shown in FIG. 2, FIG. 5, FIG. 8 and FIG. 10, the plurality of repair data lines 14 may at least overlap with the above-mentioned first adapting structure X1 located in the second metal layer M2 in the direction h3 perpendicular to the plane of the substrate. The first adapting structure X1 may be electrically connected to the third doped region scan21 of the data writing transistor T2 of the repair driving circuit 20 in the active layer S through a via hole, thereby realizing when the repair data line 14 is connected to the first adapting structure X1, the repair data line 14 may be electrically connected to the data writing transistor T2 of the repair driving circuit 20 located in the active layer S through the first adapting structure X1 to transmit the data voltage to the source or drain of the data writing transistor T2.

Specifically, as shown in FIG. 2 and FIG. 3, a parasitic capacitor Q3 may be formed at the intersection of the repair data line 14 and the first adapting structure X1. A parasitic capacitor Q3-1 may be formed at the intersection of the repair data line 14-1 and the first adapting structure X1, and a parasitic capacitor Q3-2 may be formed at the intersection between the other repair data line 14-2 and the first adapting structure X1.

FIG. 10 shows two repair data lines 14 in the third metal layer M3. In a specific implementation, when one repair driving circuit 20 corresponds to a larger number of repair data lines 14, such as three or more, all repair data lines 14 corresponding to one repair driving circuit 20 may be located in the third metal layer M3 such that the etching effect of each repair data line 14 may be more consistent, and thereby improving the display uniformity of the display panel.

As shown in FIG. 2, FIG. 5, FIG. 8 and FIG. 10, the lateral reset voltage line vref-1 located in the active layer S may be electrically connected to the sixth adapting structure X6 through the via hole, and the sixth adapting structure X6 may be electrically connected to the vertical reset voltage line vref-2 located in the third metal layer M3 through the via hole, thereby realizing the lateral reset voltage line vref-1 located in the active layer S to be electrically connected with the vertical voltage line vref-2 of the third metal layer M3 through the sixth adapting structure X6, that is, the grid design of the reset voltage line may be realized.

As shown in FIG. 2, FIG. 5 and FIG. 10, the power supply voltage line PVDD may be electrically connected to the tenth adapting structure X10 located in the second metal layer M2 through the via hole. The tenth adapting structure X10 may be electrically connected to the first doped region S11 of the first light-emitting control transistor T1 located in the active layer S through the via hole, thereby realizing that the power supply voltage line PVDD located in the third metal layer M3 may be electrically connected to the first light-emitting control transistor T1 located in the active layer S through the tenth adapting structure X10 to transmit the power supply voltage to the source or drain of the first light-emitting control transistor T1.

It can be understood that when the power supply voltage line PVDD located in the third metal layer M3 is electrically connected to the second electrode C2 of the capacitor metal layer MC, the second metal layer M2 may also be used an adaptor, which is not shown in this embodiment.

As shown in FIG. 2, FIG. 7 and FIG. 10, the power supply voltage line PVDD may be electrically connected to the second electrode C2 of the first storage capacitor C and the second electrode C2 of the second storage capacitor C' located in the capacitor metal layer MC the tenth via hole K10 to transmit the power supply voltage to the first storage capacitor C and the second storage capacitor C'.

As shown in FIGS. 2-3, the pixel driving circuit 31 may include a driving transistor T3, a data writing transistor T2, a first reset transistor T5, a second reset transistor T7, a threshold compensation transistor T4, a first light-emitting control transistor T1, a second light-emitting control transistor T6 and a first storage capacitor C. The first electrode of the first light-emitting control transistor T1 may be electrically connected to the power supply voltage line PVDD, the second electrode of the first light-emitting control transistor T1 may be electrically connected to the first electrode of the driving transistor T3, and the gate of the first light-emitting control transistor T1 may be electrically connected to the light-emitting control line emit. The first electrode of the first reset transistor T5 may be electrically connected to the reset voltage line vref, the second electrode of the first reset transistor T5 may be electrically connected to the gate electrode of the driving transistor T3, and the gate electrode of the first reset transistor T5 may be electrically connected to the first scan line scan1. The first electrode of the threshold compensation transistor T4 may be electrically connected to the second electrode of the driving transistor T3, the second electrode of the threshold compensation transistor T4 may be electrically connected to the gate electrode of the driving transistor T3, and the gate electrode of the threshold compensation transistor T4 may be electrically connected to the second scan line scan2. The first electrode of the data writing transistor T2 may be electrically connected to the pixel data line 15, the second electrode of the data writing transistor T2 may be electrically connected to the first electrode of the driving transistor T3, and the gate electrode of the data writing transistor T2 may be connected to the second scan line scan2. The second electrode of the first storage capacitor C may be electrically connected to the power supply voltage line PVDD, and the first electrode of the first storage capacitor C may be electrically connected to the gate of the driving transistor T3. The first electrode of the second light-emitting control transistor T6 may be electrically connected to the second electrode of the driving transistor T3, the gate electrode of the second light-emitting control transistor T6 may be electrically connected to the light-emitting control line emit, and the second electrode of the second light-emitting control transistor T6 may be electrically connected to the anode of light-emitting element 32. The first electrode of the second reset transistor T7 may be electrically connected to the reset voltage line vref, the gate electrode of the second reset transistor T7 may be electrically connected to the third scan line scan3, and the second electrode of the second reset transistor T7 may be electrically connected to the anode of the light-emitting element 32.

Figure 11:
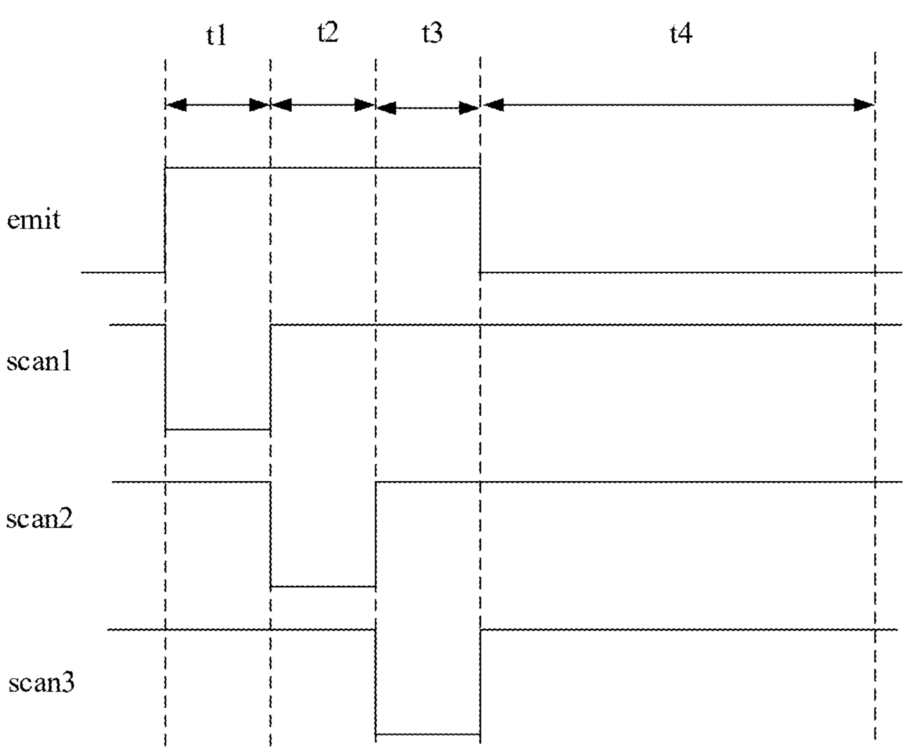
FIG. 11 illustrates an exemplary driving time sequence of a driving circuit according to various disclosed embodiments of the present disclosure.

FIG. 11 is a schematic diagram of the operation time sequence of a pixel driving circuit according to various disclosed embodiments of the present disclosure. As shown in FIG. 2, FIG. 3 and FIG. 11, when the pixel driving circuit 31 is in operation, the operation process of the pixel driving circuit may include a first reset phase t1, a charging phase t2, a second reset phase t3 and a light-emitting phase t4.

In the first reset phase t1, the first scan line scan1 may control the first reset transistor T5 to be turned on, and the reference voltage provided by the reset voltage line vref may reset the first node N1 through the first reset transistor T5. During the charging phase t2, the second scan line scan2 may control the data writing transistor T2 and the threshold compensation transistor T4 to be turned on, and the data voltage Vdata provided by the pixel data line 15 may be written into the second node N2 through the data writing transistor T2. At this phase, the driving transistor T3 may be turned on. The potential of the first node N1 may continue to change until the potential VN1 of the first node N1 changes to VN1=Vdata|Vth|. Vdata may be the data voltage provided by the pixel data line 15 and Vth may be the threshold voltage of the driving transistor T3. In the second reset phase t2, the third scan line scan3 may control the second reset transistor T7 to be turned on, and the reference voltage provided by the reset voltage line vref may reset the fourth node N4 through the second reset transistor T7. In the light-emitting phase t4, the first light-emitting control transistor T1, the second light-emitting control transistor T6 and the driving transistor T3 may be turned on, and under the action of the first power supply voltage provided by the power supply voltage line PVDD and the second power supply voltage provided by the second power supply voltage line PVEE, the current path between the power supply voltage line PVDD and the second power supply voltage line PVEE may be turned on, and the light-emitting element 32 electrically connected to the pixel driving circuit 31 may be lighted up.

Figure 12:
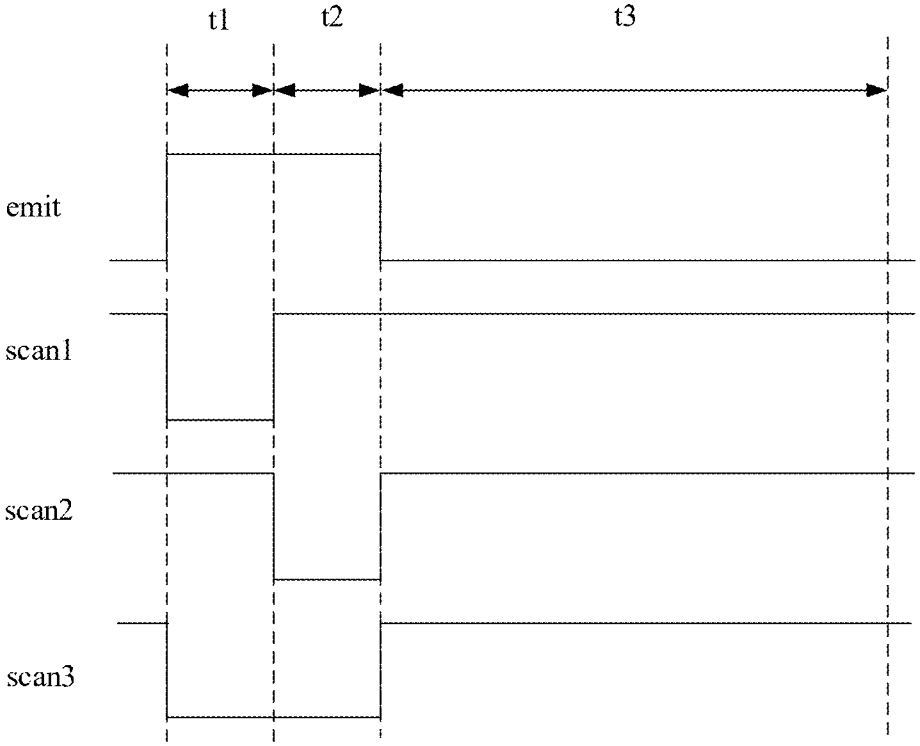
FIG. 12 illustrates another exemplary driving time sequence of a driving circuit according to various disclosed embodiments of the present disclosure.

FIG. 12 is a schematic diagram of an operation time sequence of another exemplary pixel driving circuit according to various disclosed embodiments of the present disclosure. As shown in FIG. 2, FIG. 3 and FIG. 12, in another embodiment, when the pixel driving circuit 31 is in operation, the operation process of the pixel driving circuit may include a reset phase t1, a charging phase t2 and a light-emitting phase t3.

In the reset phase t1, the first scan line scan1 and the third scan line scan3 may control the first reset transistor T5 and the second reset transistor T7 to be turned on, and the reference voltage provided by the reset voltage line vref may reset the first node N1 and the fourth node N4 through the first reset transistor T5 and the second reset transistor T7. During the charging phase t2, the second scan line scan2 may control the data writing transistor T2 and the threshold compensation transistor T4 to be turned on, and the data voltage Vdata provided by the pixel data line 15 may be written into the second node N2 through the data writing transistor T2. At this phase, the driving transistor T3 may be turned on, the potential of the first node N1 may continue to change until the potential VN1 of the first node N1 changes to VN1=Vdata|Vth|. Vdata may be the data voltage provided by the pixel data line 15, and Vth may be the threshold voltage of the driving transistor T3. At the same time, during the charging phase t2, the third scan line scan3 may control the second reset transistor T7 to be turned on, and the reference voltage provided by the reset voltage line vref may reset the fourth node N4 through the second reset transistor T7. In the light-emitting phase t3, the first light-emitting control transistor T1, the second light-emitting control transistor T6 and the driving transistor T3 may be turned on, under the action of the first power supply voltage provided by the power supply voltage line PVDD and the second power supply provided by the second power supply voltage line PVEE, the current path between the power supply voltage line PVDD and the second power supply voltage line PVEE may be turned on, and the light-emitting element 32 electrically connected to the pixel driving circuit 31 may be lighted up.

Figure 13:
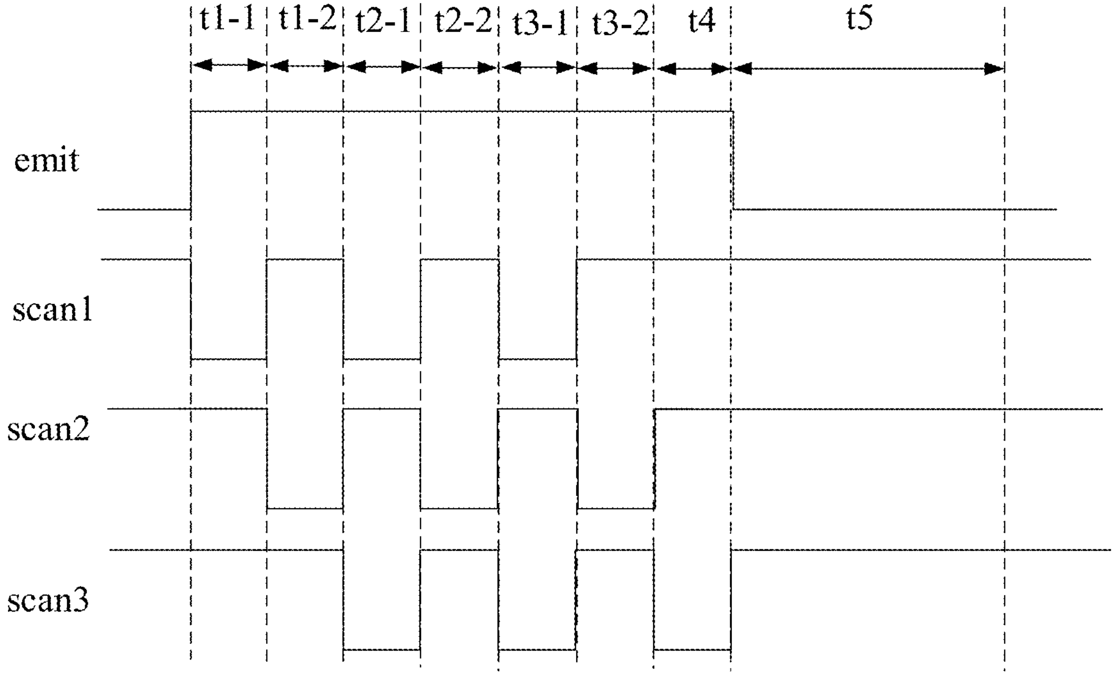
FIG. 13 illustrate another exemplary driving time sequence of a driving circuit according to various disclosed embodiments of the present disclosure.

FIG. 13 is a schematic diagram of an exemplary operation time sequence of another exemplary pixel driving circuit according to various disclosed embodiments of the present disclosure. As shown in FIG. 2, FIG. 3 and FIG. 13, in another embodiment, when the pixel driving circuit 31 is in operation, the working process of the pixel driving circuit may include a first reset phase t1-1, a first charging phase t1-2, a second reset phase t2-1, a second charging phase t2-2, a third reset phase t3-1, a third charging phase t3-2, a fourth reset phase t4 and a light-emitting phase t5. In the first reset phase t1-1, the reference voltage provided by the reset voltage line vref may reset the first node N1 through the first reset transistor T5. In the second reset phase t2-1 and the third reset phase t3-1, the reference voltage provided by the reset voltage line vref may reset the first node N1 through the first reset transistor T5, and the reference voltage provided by the reset voltage line vref may reset the fourth node N4 through the second reset transistor T7. In the fourth reset phase t4, the reference voltage provided by the reset voltage line vref may reset the fourth node N4 through the second reset transistor T7. Compared with FIG. 11 and FIG. 12, in the time sequence shown in FIG. 13, by resetting the first node N1 and the fourth node N4 multiple times and writing data to the first node N1 multiple times, the display panel may be made to have a minimized flicker under the low grayscale.

As shown in FIG. 2 and FIG. 3, the repair driving circuit 20 may include a driving transistor T3, a data writing transistor T2, a first reset transistor T5, a second reset transistor T7, a threshold compensation transistor T4, a first light-emitting control transistor T1, a second light-emitting control transistor T6 and the first storage capacitor C. The first electrode of the first light-emitting control transistor T1 may be electrically connected to the power supply voltage line PVDD, the second electrode of the first light-emitting control transistor T1 may be electrically connected to the first electrode of the driving transistor T3, and the gate of the first light-emitting control transistor T1 may be electrically connected to the light-emitting control line emit. The first electrode of the first reset transistor T5 may be electrically connected to the reset voltage line vref, the second electrode of the first reset transistor T5 may be electrically connected to the gate electrode of the driving transistor T3, and the gate electrode of the first reset transistor T5 may be electrically connected to the first scan line scan1. The first electrode of the threshold compensation transistor T4 may be electrically connected to the second electrode of the driving transistor T3, the second electrode of the threshold compensation transistor T4 may be electrically connected to the gate electrode of the driving transistor T3, and the gate electrode of the threshold compensation transistor T4 may be connected to the second scan line scan2. When the repair driving circuit 20 participates in the pixel repair, the first electrode of the data writing transistor T2 may be electrically connected to one of the plurality of repair data lines 14, the second electrode of the data writing transistor T2 may be electrically connected to the first electrode of the driving transistor T3, and the gate of the data writing transistor T2 may be electrically connected to the second scanning line scan2. The second electrode of the first storage capacitor C may be electrically connected to the power supply voltage line PVDD, and the first gate of the first storage capacitor C may be electrically connected to the gate of the driving transistor T3. The first electrode of the second light-emitting control transistor T6 may be electrically connected to the second electrode of the driving transistor T3, and the gate electrode of the second light-emitting control transistor T6 may be electrically connected to the light-emitting control line emit.

As shown in FIG. 2, in the repair driving circuit 20, the second gate of the second light-emitting control transistor T6 may be electrically connected to the second adapting structure X, and there may be an overlap between the second adapting structure X2 and the repair connection line RL in the direction h3 perpendicular to the substrate. In another embodiment, the second adapting structure X2 and the repair connection line RL may also be directly electrically connected through the via hole.

As shown in FIG. 2, in the repair driving circuit 20, the first electrode of the second reset transistor T7 may be electrically connected to the lateral reset voltage line vref-1, and the second electrode of the second reset transistor T7 may be electrically connected to the third adapting structure X3. The third adapting structure X3 may overlap with the repair connection line RL in the direction h3 perpendicular to the plane of the substrate, and may form the first parasitic capacitor Q1. Furthermore, with reference to FIGS. 2-3, a second parasitic capacitor Q2 may be formed at the overlap area between the repair connection line 14 and the first transfer structure X1. In FIG. 3, a second parasitic capacitance Q2-1 may be formed at the overlap area of the repair connection line 14 corresponding to the repair driving circuit 20 and the first adapting structure X1 in a pixel driving circuit 31-1. The overlap area between the repair connection line 14 corresponding to the repair driving circuit 20 and the first adapting structure X1 in another pixel driving circuit 31-2 may form a second parasitic capacitor Q2-2.

When the repair driving circuit 20 participates in pixel repair, its working time sequence may be same as that of the pixel driving circuit 31 and will not be described again.

As shown in FIG. 2 and FIG. 3, the repair driving circuit 20 may further include a second storage capacitor C'. The second electrode of the second storage capacitor C' may be electrically connected to the power supply voltage line PVDD. The first electrode of the second storage capacitor C may be electrically connected to the second electrode of the second reset transistor M7.

The capacitance storage capacity of the second storage capacitor C' may usually be larger than the capacitance storage capacity of the first storage capacitor C. For example, the capacitance of the second storage capacitor C' may be 3-5 times of that of the first storage capacitor C. When the repair driving circuit 20 participates in pixel repair, that is, when the repair driving circuit 20 is used to drive the light-emitting element 32 to emit light, the setting of the second storage capacitor C' may make the repaired light-emitting element turn on slower than other normal light-emitting elements. Therefore, the light-emitting element may be prevented from producing bright spots during low-grayscale display.

As shown in FIGS. 2-3, the repair driving circuit 20 may further include a repair control transistor M8. The first electrode of the repair control transistor M8 may be electrically connected to the second electrode of the second reset transistor M7. The second electrode of the repair control transistor M8 may be electrically connected to the second electrode of the second reset transistor M7. The second electrode of the second light-emitting control transistor M6 may be electrically connected to the repair connection line RL, and the gate electrode of the repair control transistor M8 may be electrically connected to the light-emitting control line emit.

The repair control transistor M8 may be configured to prevent the reference voltage provided by the lateral reset voltage line vref-1 from being repeatedly written into the parasitic capacitor on the repair connection line RL in stages other than the light-emitting stage when the repair driving circuit 20 is not involved in pixel repair. This may avoid repeated charging and discharging of the repair connection line RL and save electric energy.

Figure 14:
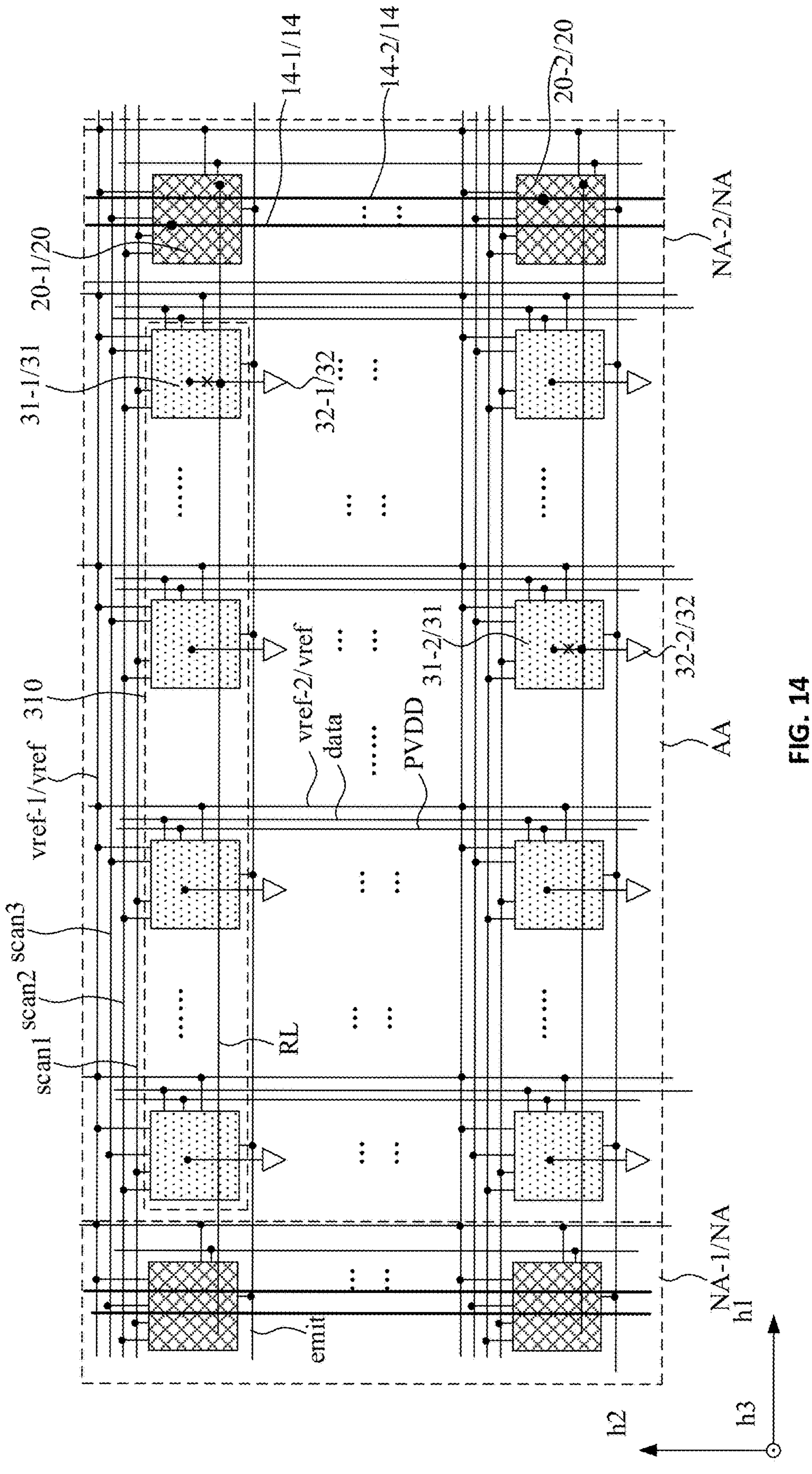
FIG. 14 illustrates a portion of another exemplary display panel according to various disclosed embodiments of the present disclosure.

As shown in FIG. 14, combined with FIGS. 2-3, when a pixel driving circuit 31-1 in the display panel fails, causing the light-emitting element 32-1 corresponding to the pixel driving circuit 31-1 to fail to emit light normally, at this time, it may be necessary to use the repair connection line RL corresponding to the pixel drive circuit 31-1 and the repair driving circuit 20-1 to drive the light-emitting element 32-1 to emit light. Specifically, as shown in FIG. 14, when the pixel driving circuit 31-1 fails, the electrical connection between the light-emitting element 32-1 and the pixel driving circuit 31-1 may need to be cut off first. Specifically, the electrical connection between the light-emitting element 32 and the second light-emitting control transistor T6 may need to be cut off, and then the overlap portion between the repair connection line RL and the fourth adapting structure 20-1 may be melted to connect to achieve the connection between the repair connection line RL and the light-emitting element 32-1 such that the repair driving circuit 20-1 may drive the light-emitting element 32-1 to emit light through the repair connection line RL.

Figure 15:
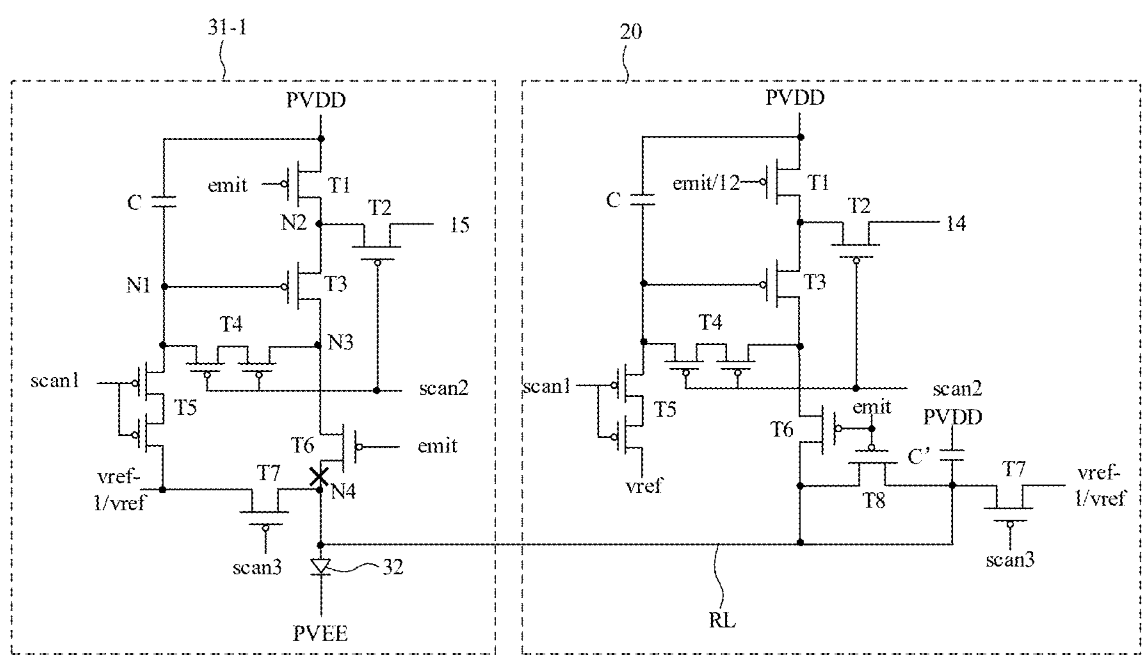
FIG. 15 illustrates a circuit mechanism of another exemplary display panel according to various disclosed embodiments of the present disclosure.

The circuit schematic diagram of the repair driving circuit 20 when participating in the pixel repair is shown in FIG. 15. As shown in FIG. 15 and combined with FIG. 2, FIG. 3 and FIG. 14, the parasitic capacitor Q1 may be formed at the interaction between the repair connection line RL and the pixel driving circuit 20. Q2-1 may be welded into wires. The repair connection line RL and other normal pixel driving circuits 31-2 may still form the parasitic capacitors Q2-2 at their overlap areas. At this time, if the repair driving circuit 20-1 has been electrically connected to a repair data line 14-1, the repair driving circuit 20-1 may directly use the data signal provided by the repair data line 14-1; if there are overlap areas between the repair driving circuit 20-1 and multiple repair data lines 14 in the h3 direction, as shown in FIG. 2, then the repair driving circuit 20-1 may be electrically connected to one of the repair data lines 14-1 such that the repair driving circuit 20-1 may utilize the data signal provided by the repair data line 14-1. In this way, when there are fewer defective pixels in the display panel, the repair driving circuit 20-1 and the repair data line 14-1 electrically connected thereto may be directly used for repair, and there may be no need to weld the repair driving circuit 20-1 and the repair data line 14-1 for connection, which may reduce the operating steps in the repair process and improve production efficiency.

As shown in FIG. 2 and FIG. 14, when the repair driving circuit 20-1 participates in pixel repair, in addition to electrically connecting the light-emitting element 32-1 to the repair connection line RL, the repair driving circuit 20-1 may also need to be electrically connected to the repair connection line RL. That is, it may also be necessary to weld the second adapting structure X2 and the third adapting structure X3 at the overlap area with the repair connection line RL (in the embodiment where the second adapting structure X2 has been electrically connected to the repair connection line RL, only need to weld the intersection of the third adapting structure X3 and the repair connection line RL).

Usually, multiple repair driving circuits arranged along the column direction only have one repair data line corresponding to each other. When one of the repair driving circuits participates in pixel repair, the repair data line will copy the defective pixel (hereinafter referred to as the first defective pixel) corresponding data signal, and provide the data signal to the repair driving circuit participating in the repair such that the repair driving circuit can use the corresponding data signal to drive the light-emitting element of the first defective pixel to emit light. At this time, multiple repair driving circuits arranged along the column direction will receive the same data signal through this repair data line, that is, the repair data line is occupied, and when another defective pixel (hereinafter referred to as the second defective pixel) appears in other rows of pixel drive circuits, especially when the second defective pixel and the first defective pixel are in different columns, even if the repair driving circuit corresponding to the second defective pixel is not occupied, the data signal received by the repair driving circuit cannot correspond to it and the second defective pixel cannot be repaired.

In view of this, the display panel provided by the present disclosure sets at least two repair data lines corresponding to one repair driving circuit such that when one of the repair data lines is occupied by other repair driving circuits, the other or more repair driving lines may also provide the repair data line to the display panel, and another repair driving circuit may separately provide data signals, thereby enabling the display panel to repair more defective pixels when the same number of repair driving circuits are provided, thereby improving the pixel fault tolerance rate of the display panel.

Specifically, as shown in FIG. 14, when the pixel driving circuit 31-1 fails and the repair driving circuit 20-1 may replace the pixel driving circuit 31-1 and drive the light-emitting element 32-1 to emit light, the repair driving circuit 20-1 and a repair data line 14-1 may be electrically connected and receive the data signal corresponding to the pixel driving circuit 31-1 provided by the repair data line 14-1. At the same time, the pixel driving circuit 31-2 located in another pixel driving circuit row may also appear to have defect, the corresponding repair driving circuit 20-2 may be used to replace the pixel driving circuit 31-2 to drive the light-emitting element 32-2 to emit light. The repair driving circuit 20-2 may be electrically connected to another repair data line 14-2, and receive the data signal corresponding to the pixel driving circuit 31-2 provided by the repair data line 14-2. As a result, both defective pixels in the display panel may be repaired.

It should be noted that in the embodiment shown in FIG. 14, multiple defective pixel driving circuits 31 may be located in different columns. FIG. 14 is only schematic, when the present disclosure is implemented and when multiple defective pixel driving circuits 31 are located in the same column, one repair data line 14 may be used to provide data signals to the light-emitting elements 32 of multiple pixel driving circuits 31 located in the same column. In some embodiments, multiple data lines 14 may be used to drive the light-emitting elements 32 in the same column of pixel driving circuit 31.

Specifically, in the embodiments shown in FIGS. 1 and 2, each repair data line 14 may only overlap with the repair driving circuit 20 in the h3 direction. When the repair driving circuit 20 participates in repair, it may need to be electrically connected with any repair data line 14.

It should be noted that in FIGS. 1-14, one repair driving circuit 20 may be provided with two repair data lines 14. FIGS. 1-14 are only examples, in an actual display panel, one repair driving circuit 20 may correspond to setting up a larger number of repair data lines 14. It is same as in the following embodiments and will not be described again.

Figure 16:
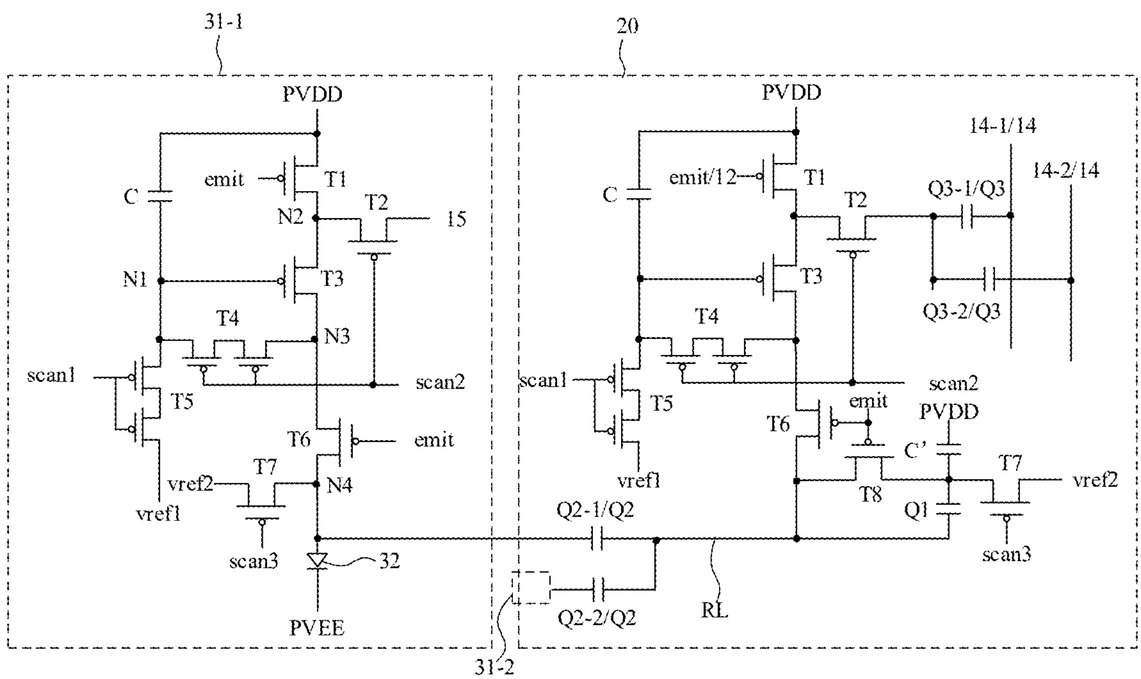
FIG. 16 illustrates a circuit mechanism of another exemplary display panel according to various disclosed embodiments of the present disclosure.

In the pixel driving circuit 31 and the repair driving circuit 20 shown in FIGS. 1-3, the horizontal reset voltage line vref-1 and the vertical reset voltage line vref-2 may be electrically connected, so the reset voltage of the first reset transistor T5 and the second reset transistor T7 may be same. In another embodiment, the horizontal reset voltage line vref-1 and the vertical reset voltage line vref-2 may be insulated from each other, thereby transmitting different reset voltages. As shown in FIG. 16, the first reset transistor T5 may be electrically connected to the first reset voltage line vref1, and the second reset transistor T7 may be electrically connected to the second reset voltage line vref2. Those skilled in the art can implement the corresponding circuit layout based on other contents of this embodiment and the circuit schematic diagram shown in FIG. 16 without exerting creative efforts, and will not be described in detail here.

In one embodiment, the first insulation layer 101 may include an inorganic material, such as at least one of silicon nitride, silicon oxynitride, silicon oxide, titanium oxide, and aluminum oxide, etc.

In one embodiment, the second insulation layer 102 may include an inorganic material, such as at least one of silicon nitride, silicon oxynitride, silicon oxide, titanium oxide, and aluminum oxide, etc. In some embodiments, the second insulation layer 102 may include multiple inorganic layers.

In one embodiment, the third insulation layer 103 may include an inorganic material, such as at least one of silicon nitride, silicon oxynitride, silicon oxide, titanium oxide, and aluminum oxide. In some embodiments, the third insulation layer 103 may include multiple inorganic layers.

In one embodiment, the fourth insulation layer 104 may include an organic insulation material, such as at least one of acrylic resin, epoxy resin, phenolic resin, polyamide resin, or polyimide resin, etc. In some embodiments, the fourth insulation layer 104 may include multiple organic layers.

In one embodiment, the fifth insulation layer 105 may include an organic insulation material, such as at least one of acrylic resin, epoxy resin, phenolic resin, polyamide resin or polyimide resin, etc. In some embodiments, the fifth insulation layer 105 may include multiple organic layers.

Figure 17:
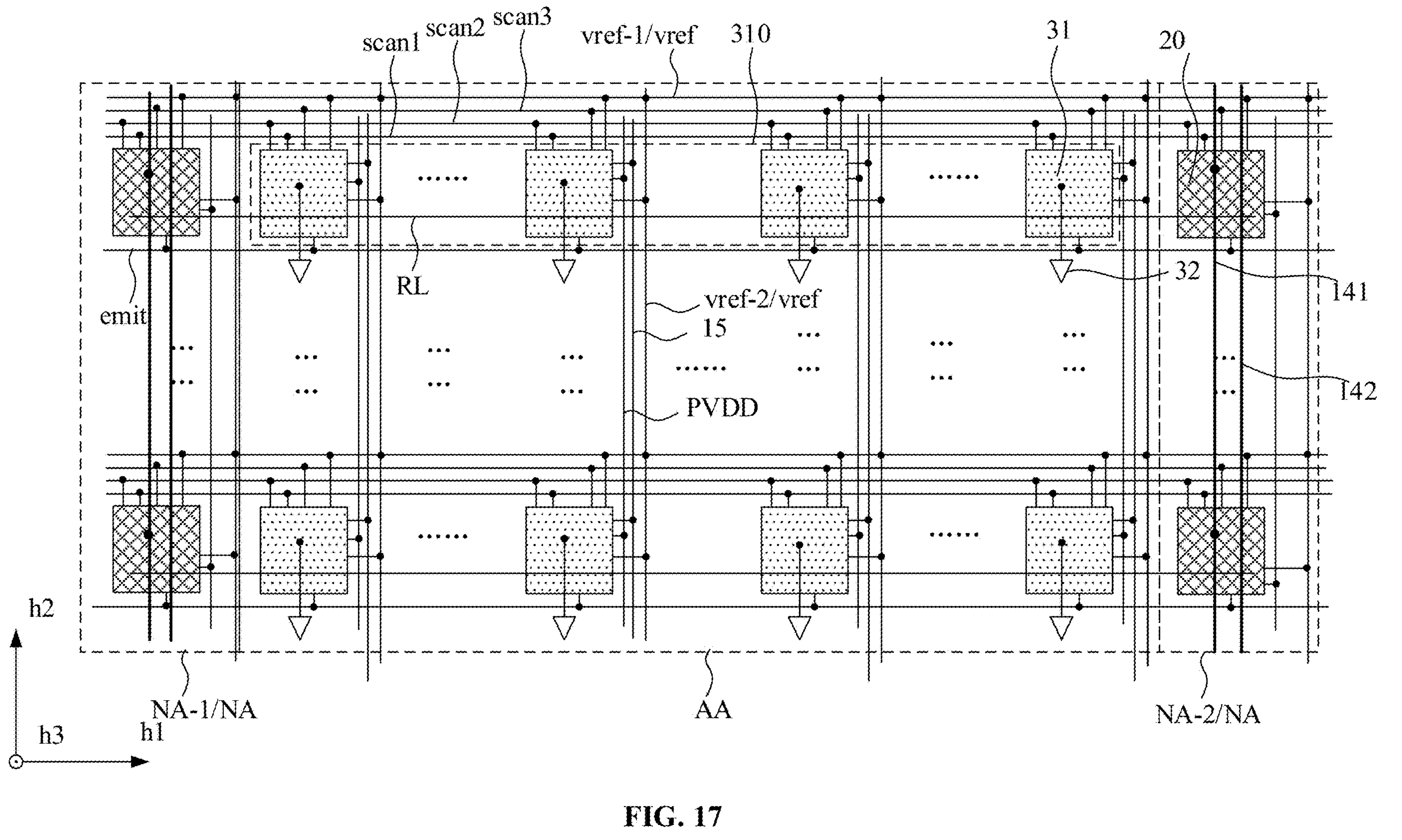
FIG. 17 illustrates a portion of another exemplary display panel according to various disclosed embodiments of the present disclosure.
Figure 18:
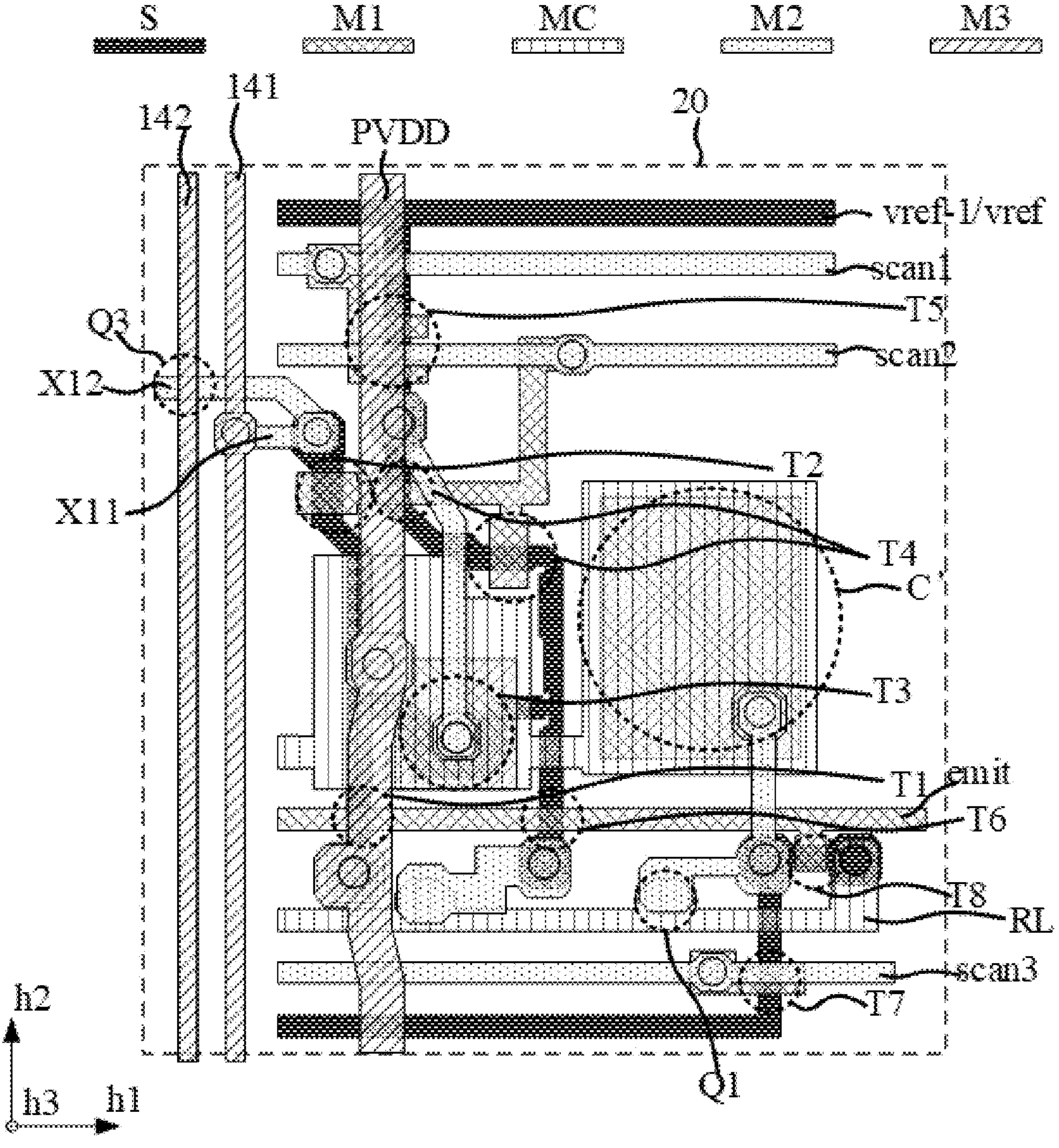
FIG. 18 illustrates a portion of a wiring layout of another exemplary display panel according to various disclosed embodiments of the present disclosure.
Figure 19:
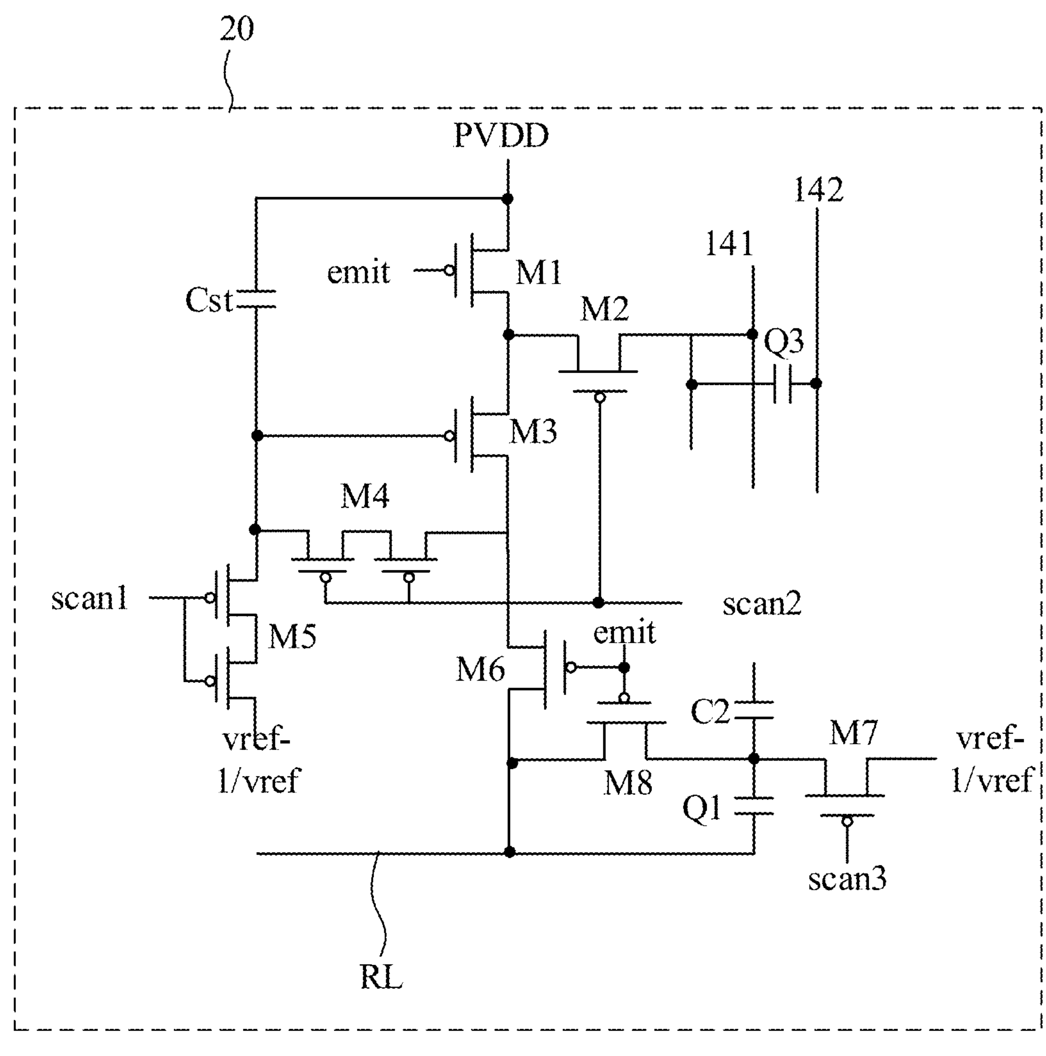
FIG. 19 illustrates a circuit mechanism of another exemplary display panel according to various disclosed embodiments of the present disclosure.

FIG. 17 illustrates a schematic diagram of a portion of an exemplary display panel according to various disclosed embodiments of the present disclosure. FIG. 18 illustrates the layout structure of a portion of an exemplary display panel according to various disclosed embodiments of the present disclosure, and FIG. 19 is a schematic diagram of the circuit corresponding to the layout structure of FIG. 18. In some embodiments, as shown in FIGS. 17-19, the plurality of repair data lines may include a first repair data line 141 and a second repair data line 142. The first adapting structure may include a first sub-connection part X11 and a second sub-connection part X12 that are electrically connected. The repair driving circuit 20 may be electrically connected to the first repair data line 141 through the first sub-connection part X11. In a direction h3 perpendicular to the plane of the substrate, the second sub-connection part X12 may at least partially overlap with the second repair data line 142.

Figure 20:
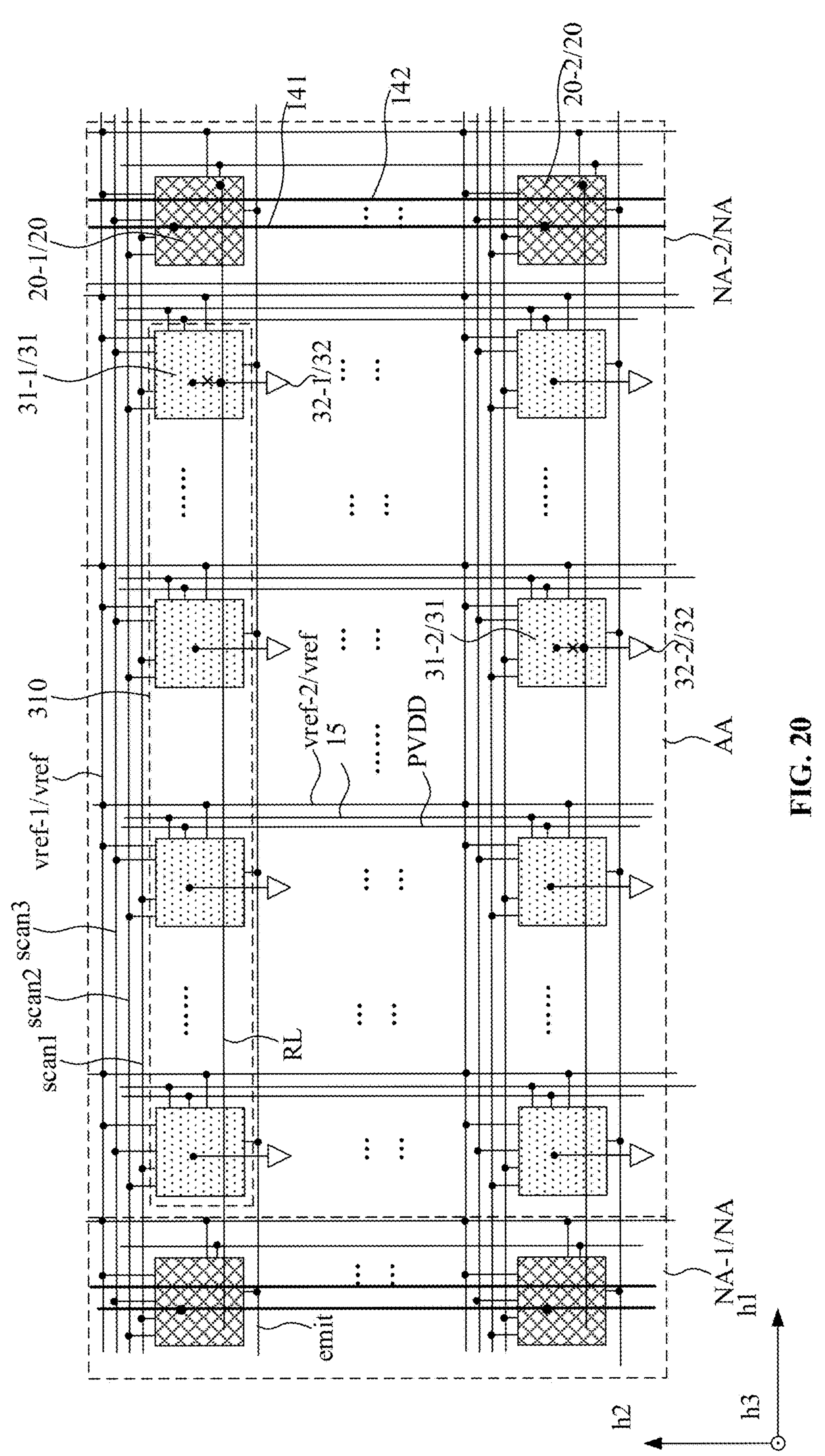
FIG. 20 illustrates a portion of another exemplary display panel according to various disclosed embodiments of the present disclosure.

Specifically, since the repair driving circuit 20 may be electrically connected to a repair data line 14 in advance, when the first defective pixel appears in the plurality of pixel driving circuits 31 corresponding to the plurality of repair driving circuits 20 arranged along the second direction h2, and the repair driving circuit 20 may participate in repairing the first defective pixel, there may be no need to connect the repair data line 14 to the repair driving circuit 20, thus simplifying the circuit repair process. When a defective pixel appears again in the plurality of pixel driving circuits corresponding to the plurality of repair driving circuits arranged in the second direction h2, taking the second defective pixel as an example, as shown in FIG. 20, the repair driving circuit 20-1 corresponding to the light-emitting element 32-1 of the first defective pixel may have occupied the first repair data line 141, the repair driving circuit 20-2 corresponding to the light-emitting element 32-2 of the second defective pixel may need to be electrically disconnected from the first repair data line 141. Specifically, the electrical connection between the repair driving circuit 20-2 and the first repair data line 141 may be disconnected at the first sub-connection portion X11 shown in FIG. 18. Then, the repair driving circuit 20-2 corresponding to the second defective pixel may be electrically connected to the second repair data line 142. Specifically, the parasitic capacitor Q3 formed at the overlap area of the second sub-connection portion X12 of the repair drive circuit 20-2 and the second repair data line 142 may be welded into wires. Accordingly, the repair driving circuit 20-2 may receive the data signal provided by the second repair data line 142 and participate in the repair of the second defective pixel.

Specifically, as shown in FIG. 18, both the first sub-connection part X11 and the second sub-connection part X12 may be located on the second metal layer M2 and may be disposed in a layer different from the first repair data line 141 and the second repair data line 142 located on the third metal layer M3. The specific connection method between the first sub-connection part X11 and the second sub-connection part X12 and the repair driving circuit 20 may refer to the connection method between the first adapting structure X1 and the repair driving circuit 20 in the above embodiment, and will not be described again here.

Figure 21:
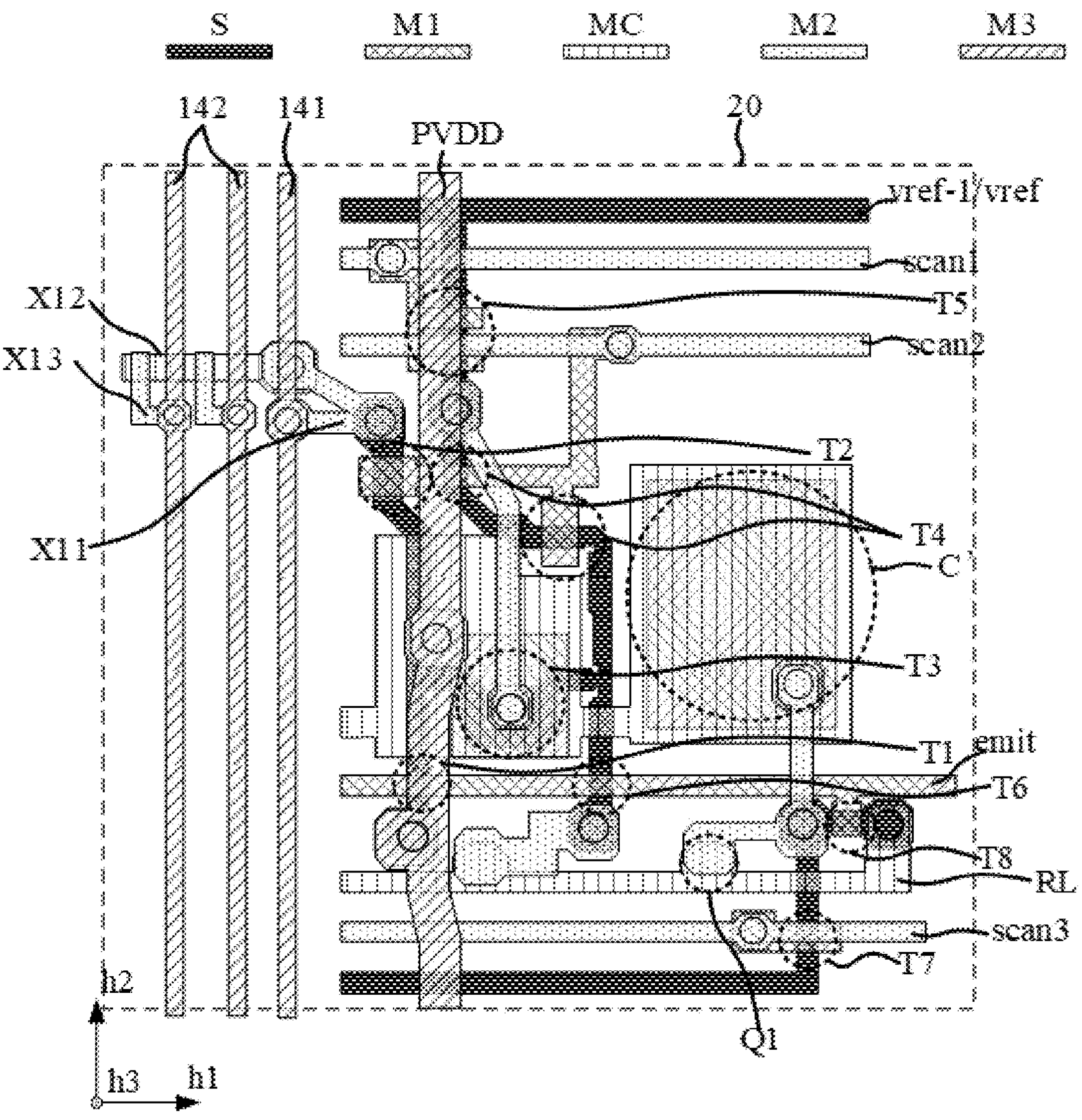
FIG. 21 illustrates a portion of a wiring layout of another exemplary display panel according to various disclosed embodiments of the present disclosure.

In some embodiments, as shown in FIG. 21, the first sub-connection part X11 may be located on the second metal layer M2, the second sub-connection part X12 may be located on the capacitor metal layer MC, and the first sub-connection part X12 may be disposed on a layer different from the second-sub connection part X12. Specifically, the first adapting structure may also include a third sub-connection part X13 shown in FIG. 21. The third sub-connection part X13 may be located in the second metal layer M2. The third sub-connection part X13 and a second repair data line 142 may be electrically together and may overlap with the second sub-connection part X12 in the direction h3 perpendicular to the plane of the substrate such that the second repair data line 142 may be electrically connected with the second sub-connection part X12 through the third sub-connection part X13.

It should be noted that in FIGS. 17-19, one repair driving circuit 20 may be provided with a first repair data line 141 and a second repair data line 142. In FIG. 21, one repair driving circuit 20 may be correspondingly provided with one repair data line 141 and two second repair data lines 142. FIGS. 17-21 are only examples, in an actual display panel, one repair driving circuit 20 may correspond to a larger number of second repair data lines 142, which is same as in the following embodiments and will not be described again.

Figure 23:
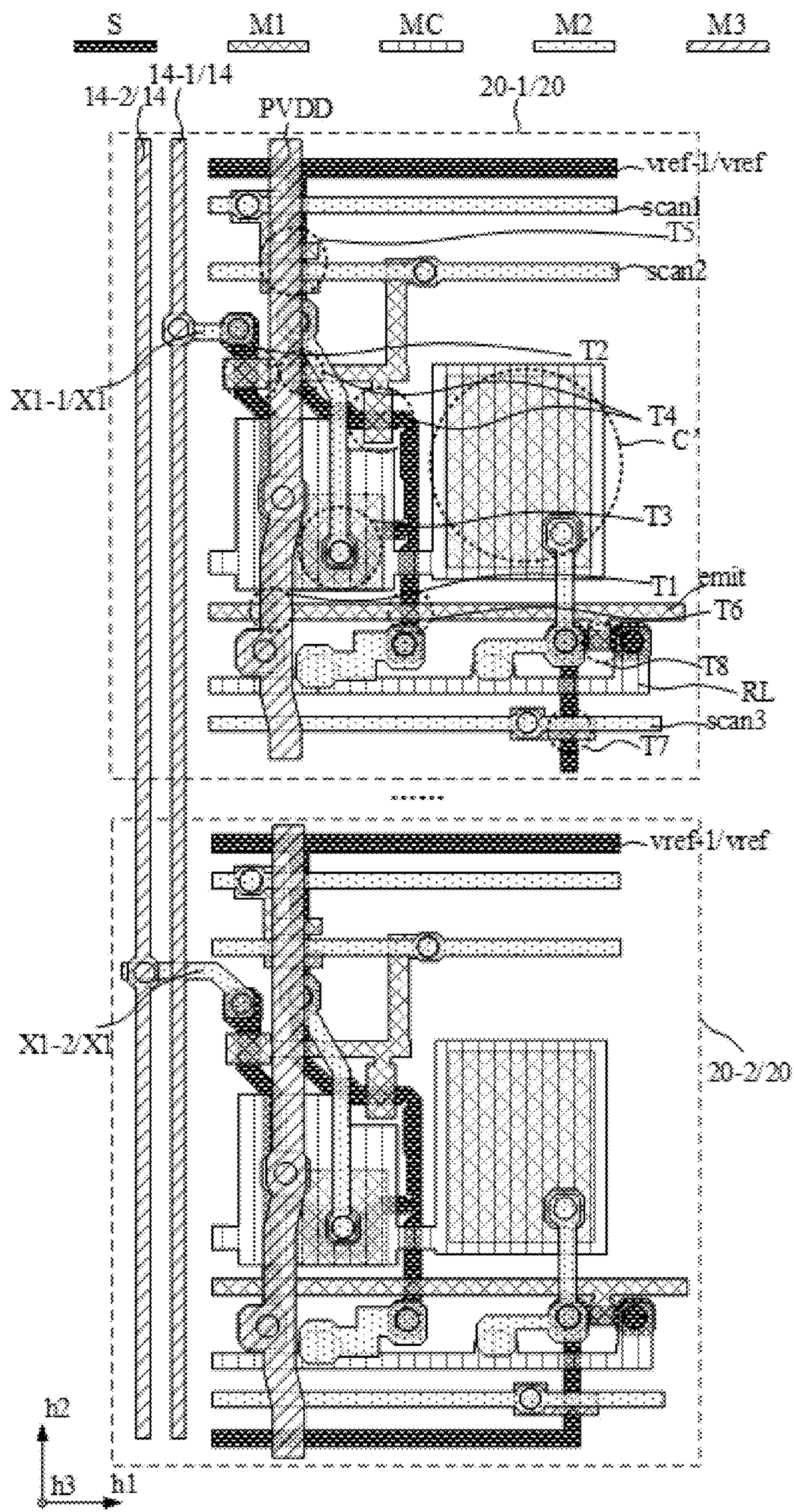
FIG. 23 illustrates a portion of a wiring layout of another exemplary display panel according to various disclosed embodiments of the present disclosure.

In some embodiments, as shown in FIG. 21 and FIG. 23, the display panel may include a plurality of repair driving circuit groups 200 arranged in the second direction h2. Each driving circuit group 200 may include at least one repair driving circuit 20. The same repair driving circuits 20 in the driving circuit group 200 may be electrically connected to the same repair data line 14 through the corresponding first adapting structure X1, and the repair driving circuits 20 in different repair driving circuit groups 200 may be respectively connected to different repair data lines 14 through the corresponding first adapting structure X1.

Figure 22:
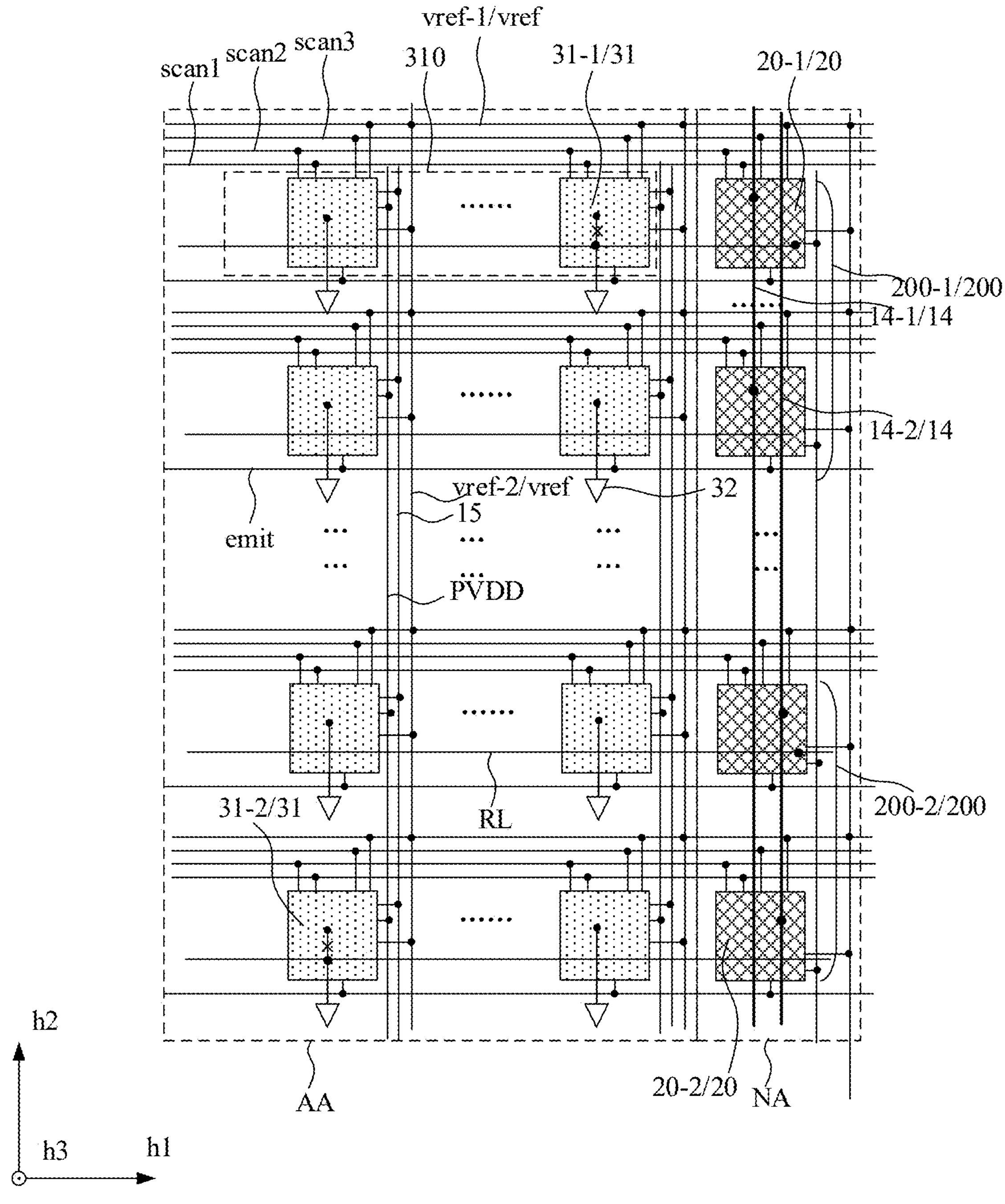
FIG. 22 illustrates a portion of another exemplary display panel according to various disclosed embodiments of the present disclosure.

Specifically, FIG. 22 shows the first repair driving circuit group 200-1 and the second repair driving circuit group 200-2, and FIG. 23 shows the layout structure of the repair driving circuit 20-1 located in the first repair driving circuit group 200-1 and the repair driving circuit 20-2 located in the second repair driving circuit group 200-2.

Because each repair driving circuit may be pre-connected to a repair data line, when there are fewer defective pixels in the display panel, the repair driving circuit 20 and the repair data line 14 electrically connected thereto may be directly configured for repair without the need for welding the repair driving circuit 20 and the repair data line 14, thereby reducing operating steps in the repair process and improving production efficiency.

When a second defective pixel appears in the display panel, if the repair driving circuits corresponding to the first defective pixel and the second defective pixel are located in different repair driving circuit groups 200, such as the pixel driving circuit of the first defective pixel 31-1 and the pixel driving circuit 31-2 of the second defective pixel shown in FIG. 22, the repair driving circuit 20-2 corresponding to the second defective pixel may directly use the data signal provided by the repair data line 14-2 electrically connected thereto to participate in pixel repair, there may be no need to perform circuit disconnection and welding operations, and thus further simplifying the circuit repair process.

If the repair driving circuits corresponding to the first defective pixel and the second defective pixel are in the same repair driving circuit group, the circuit repair may be performed with reference to the embodiments shown in FIGS. 17-21, which will not be described again here.

Figure 24:
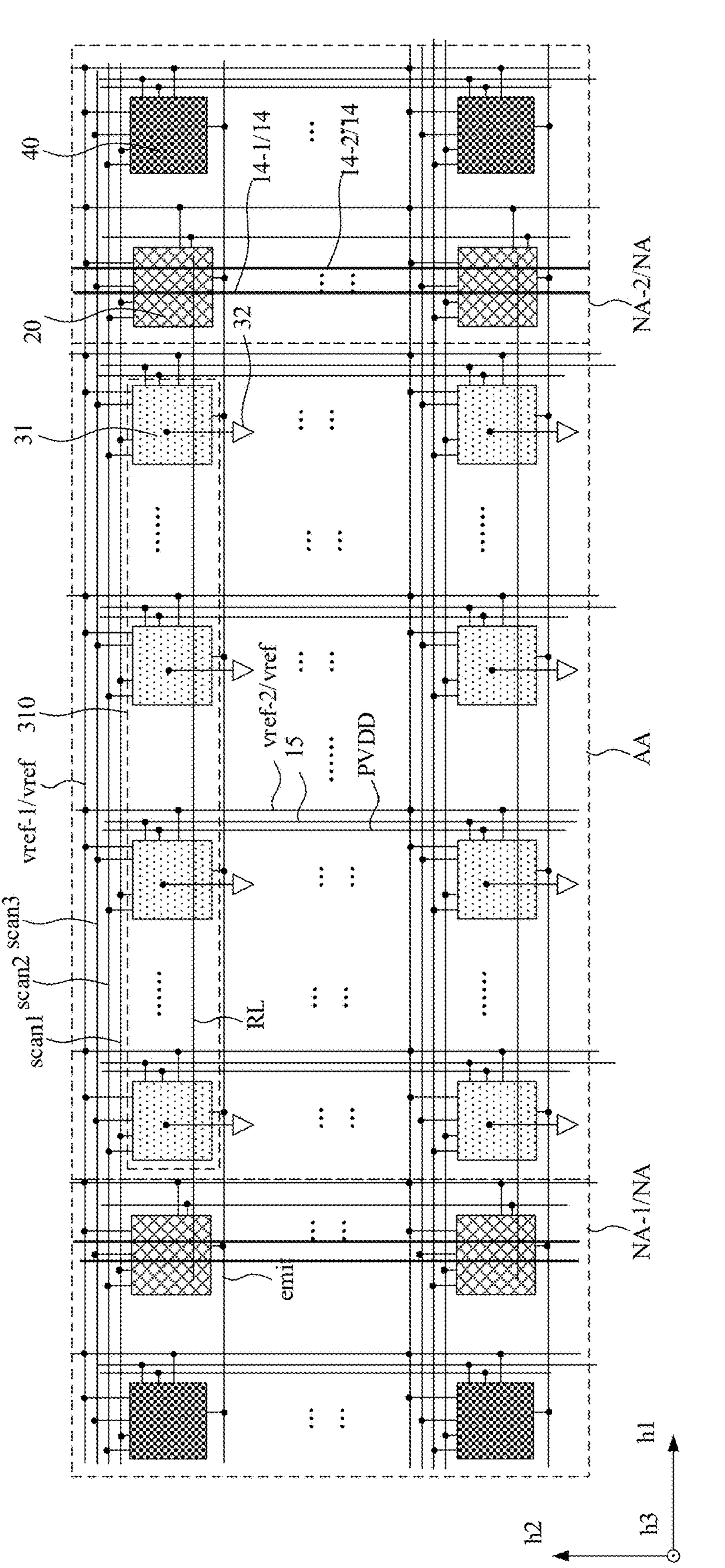
FIG. 24 illustrates a portion of another exemplary display panel according to various disclosed embodiments of the present disclosure.

In some embodiments, as shown in FIG. 24, the repair driving circuit 20 may be located in the non-display area NA of the display panel. The non-display area NA may also include a dummy pixel driving circuit 40. The dummy pixel driving circuit 40 may be located at a side of the repair driving circuit 20 away from the display area AA.

During the manufacturing process of display panels, conductive materials (conductive parts in the pixel structure, such as gates, sources, drains of transistors, electrodes of capacitors, signal lines, anodes of light-emitting elements, etc.) may need to be etched. To improve the consistency of the etching environment at the edge position and the middle position in the display area AA, when forming the pixel driving circuit 20 in each display area AA, a dummy pixel driving circuit may be formed at the position adjacent to the display area AA in the non-display area NA at the same time, making the etching effect at the edge position and the middle position in the display area AA more consistent, and thereby improving the display uniformity of the display panel.

The dummy pixel driving circuit 40 may usually be unable to drive the light-emitting element to emit light, and there may be various reasons. For example, the display panel may not be provided with a light-emitting element electrically connected to the virtual pixel driving circuit 40; or there may be a light-emitting element electrically connected, but the pixel definition layer between the anode and cathode of the light-emitting element is not removed; or the dummy pixel driving circuit 40 may miss some structures compared with the normal pixel driving circuit 20, making it unable to work properly. It can be understood that the dummy pixel driving circuit 40 may also be configured to have the same structure as the pixel driving circuit, except that it may not be able to drive the light-emitting element to emit light.

The dummy pixel driving circuit may usually be arranged around the display pixels in the display area, and may be arranged in multiple rows or columns. The specific situation may be selected according to the needs of the display panel. It can be understood that when the repair driving circuit is used to drive the light-emitting elements in the display area to emit light, its function may be equivalent to the driving circuit of the display pixel. Therefore, the dummy pixel driving circuit may be disposed on the side of the repair driving circuit adjacent to the display area. It may be set on the side of the repair driving circuit away from the display area, and may be selected according to actual needs. FIG. 23 only illustrates that the dummy pixel driving circuit is arranged on the side of the repair driving circuit away from the display area.

It can be understood that when the repair driving circuit is not used to drive the light-emitting elements in the display area to emit light, it may be multiplexed as a dummy pixel driving circuit and achieve the same effect as the dummy pixel driving circuit.

Figure 25:
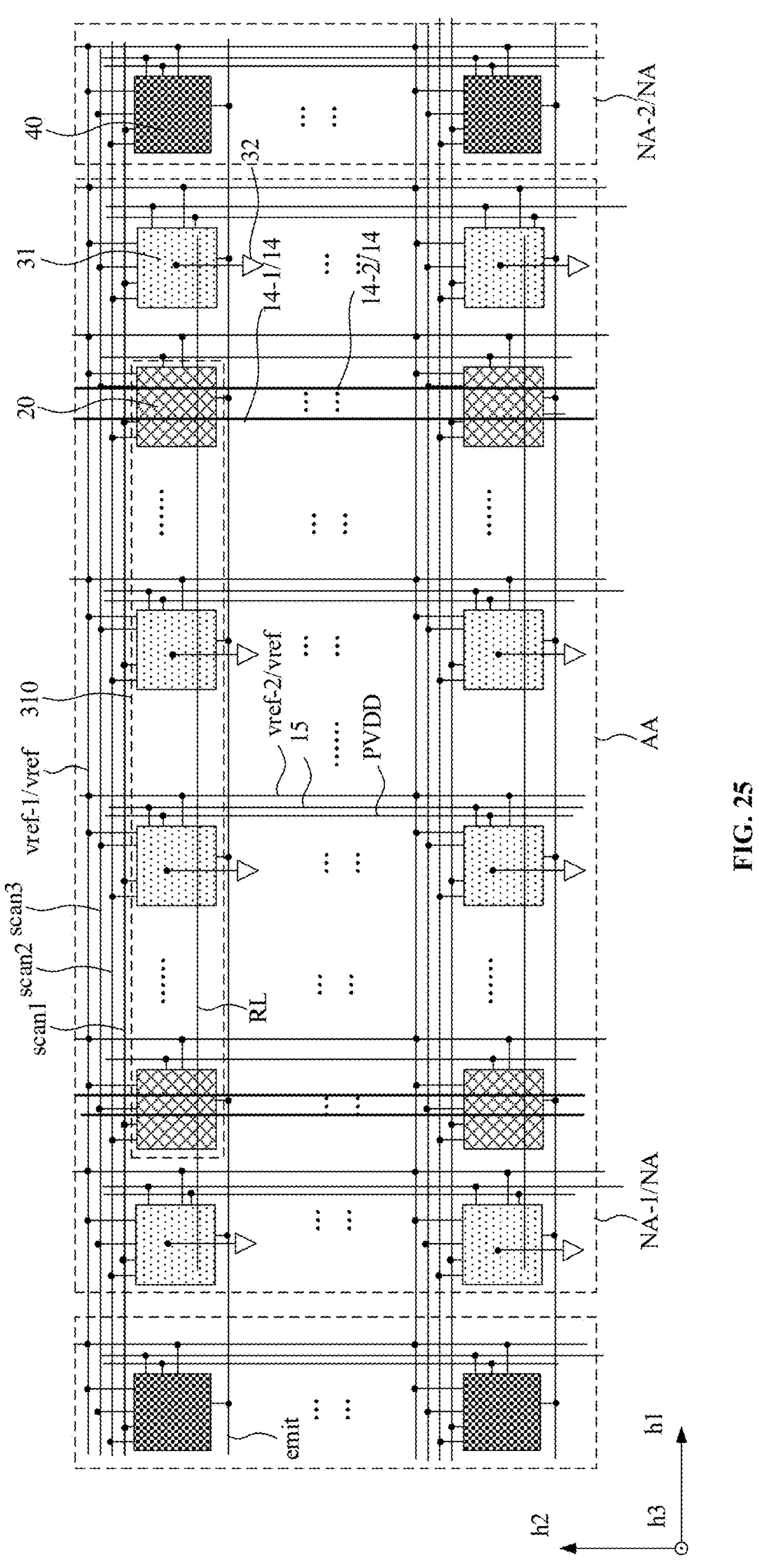
FIG. 25 illustrates a portion of another exemplary display panel according to various disclosed embodiments of the present disclosure.

As shown in FIG. 25, in some embodiments, the repair driving circuit 20 may be located in the display area AA of the display panel, and the non-display area NA may include the above-mentioned dummy pixel driving circuit.

The repair driving circuit 20 may be disposed in the display area AA, which may reduce the frame width of the display panel to a certain extent. In addition, because the display panel provided by the present disclosure may be used in medium-sized products (such as notebooks, tablets, inserted into vehicle display screens, etc.), there may be a larger space in the display area to install the repair driving circuit 20, and it may not affect the display effect of the display panel.

Figure 26:
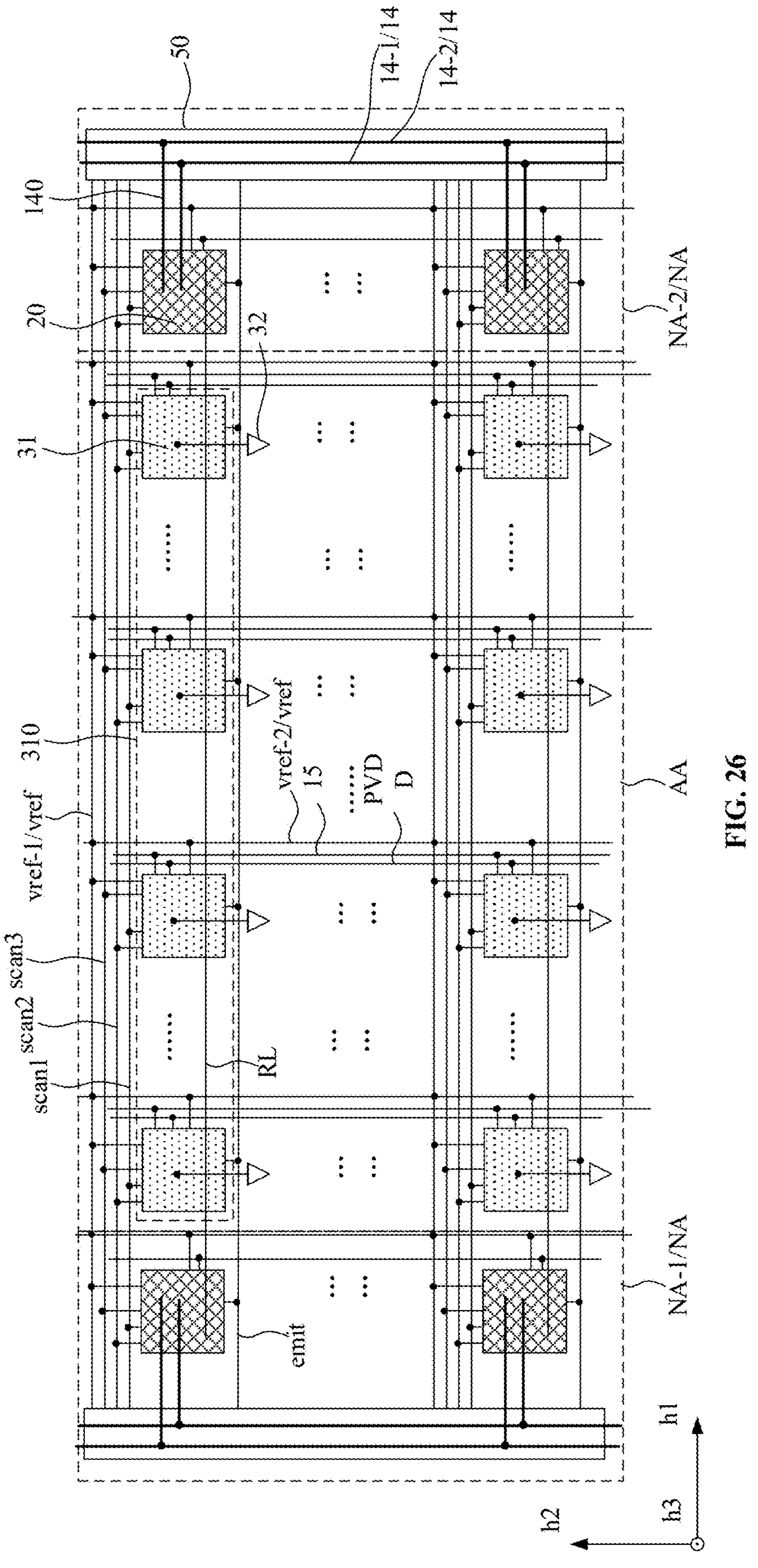
FIG. 26 illustrates a portion of another exemplary display panel according to various disclosed embodiments of the present disclosure.

As shown in FIG. 26, the display panel may also include a peripheral driving circuit 50. Along the direction h3 perpendicular to the plane of the substrate, each repair data line 14 may at least partially overlap with the peripheral driving circuit 50 and may be electrically connected to the adapting line 140. The adapting line 140 may at least partially overlap with the repair driving circuit 20 in the direction h3 perpendicular to the plane of the substrate such that the repair driving circuit 20 may be electrically connected to the repair data line 14 through the adapting line 140, while saving the wiring area the non-display area NA, the frame width of the display panel may be reduced.

Figure 27:
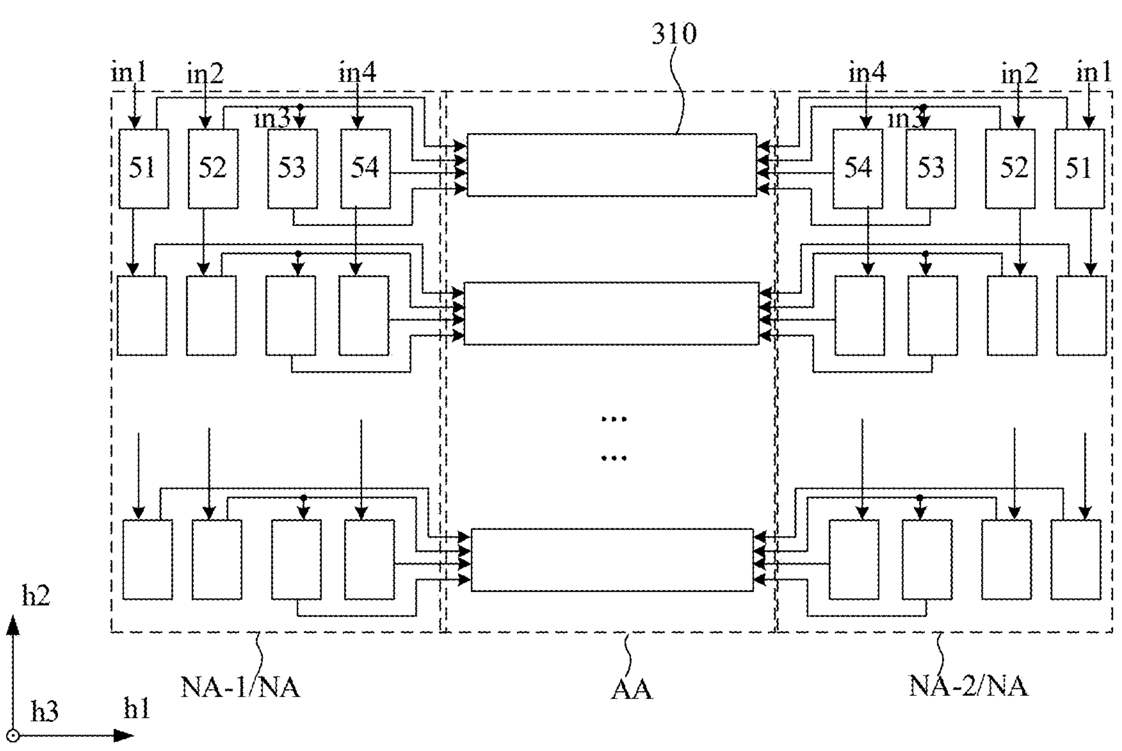
FIG. 27 illustrates a portion of another exemplary display panel according to various disclosed embodiments of the present disclosure.
Figure 28:
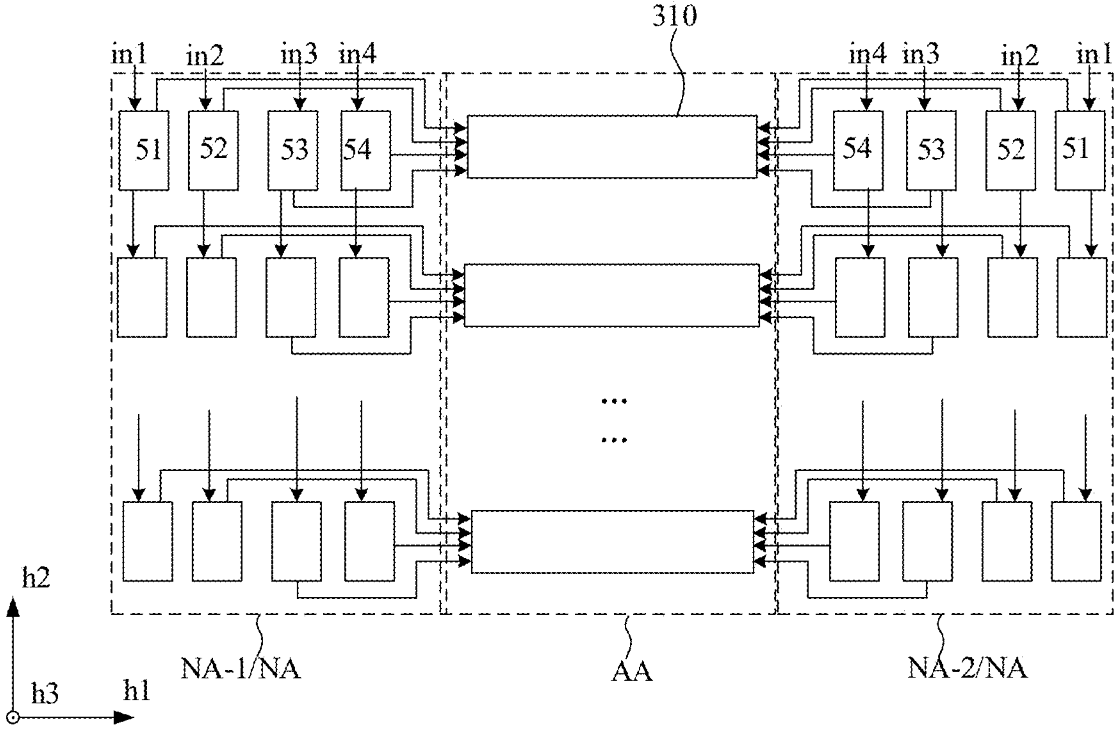
FIG. 28 illustrates a portion of another exemplary display panel according to various disclosed embodiments of the present disclosure.

In one embodiment, as shown in FIGS. 27-28, the peripheral driving circuit may specifically include a light-emitting control circuit 51 connected to the light-emitting control line emit, a first scan control circuit 52 connected to the first scan line scan1, a second scan control circuit 53 connected to the second scan line scan2, and a third scan control circuit 54 connected to the third scan line scan3. When the non-display area NA includes the repair driving circuit 20, the above-mentioned light-emitting control circuit 51, the first scan control circuit 52, the second scan control circuit 53 and the third scan control circuit 54 may all be located at a side of the repair driving circuit 20 away from the display area AA.

In one embodiment, referring to FIG. 1 and FIG. 27, the light-emitting control circuit 51 may receive the input signal in1 and provide the light-emitting control signal to the light-emitting control line emit according to the first input signal in1. The first scan control circuit 52 may receive the input signal in2 and provide a first scan control signal to the first scan line scan1 according to the input signal in2. The second scan control circuit 53 may receive the input signal in3 and provide a second scan control signal to the second scan line scan2 according to the input signal in3. The input signal in3 received by the second scan control circuit 53 may be the first scan control signal output by the first scan control circuit 52. The third scan control circuit 54 may receive the input signal in4 and provide a third scan control signal to the third scan line scan3 according to the input signal in4. The time sequence of the signal provided by the light-emitting control circuit 51, the first scan control circuit 52, the second scan control circuit 53 and the third scan control circuit 54 may refer to FIG. 11, FIG. 12 or FIG. 13.

The same peripheral driving circuit corresponding to different pixel circuit driving rows 310 may transmit the corresponding input signal in a cascade manner, and may transmit the corresponding light-emitting control signal, first scanning control signal, second scanning control signal and third scan control signal according to the direction of the input signal cascade transmission to each pixel circuit driving row 310 in sequence.

In another embodiment, referring to FIG. 1 and FIG. 28, the light-emitting control circuit 51 may receive the input signal in1 and provide the light-emitting control signal to the light-emitting control line emit according to the input signal in1. The first scan control circuit 52 may receive the input signal in2 and provide a first scan control signal to the first scan line scan1 according to the input signal in2. The second scan control circuit 53 may receive the input signal in3 and provide a second scan control signal to the second scan line scan2 according to the input signal in3. The third scan control circuit 54 may receive the input signal in4 and provide a third scan control signal to the third scan line scan3 according to the input signal in4. Different from FIG. 27, in the embodiment shown in FIG. 28, the input signal in3 received by the second scan control circuit 53 may not be dependent of the second input signal in2 and the first scan control circuit 52. The signals provided by the light-emitting control circuit 51, the first scan control circuit 52, the second scan control circuit 53 and the third scan control circuit 54 may be referred to FIG. 11, FIG. 12 or FIG. 13. The same peripheral driving circuit corresponding to different pixel circuit driving rows 310 may transmit the corresponding input signal in a cascade manner, and transmit the corresponding light-emitting control signal, first scanning control signal, second scanning control signal and third scan control signal according to the direction of the input signal cascade transmission to each pixel circuit driving row 310 in sequence.

Figure 29:
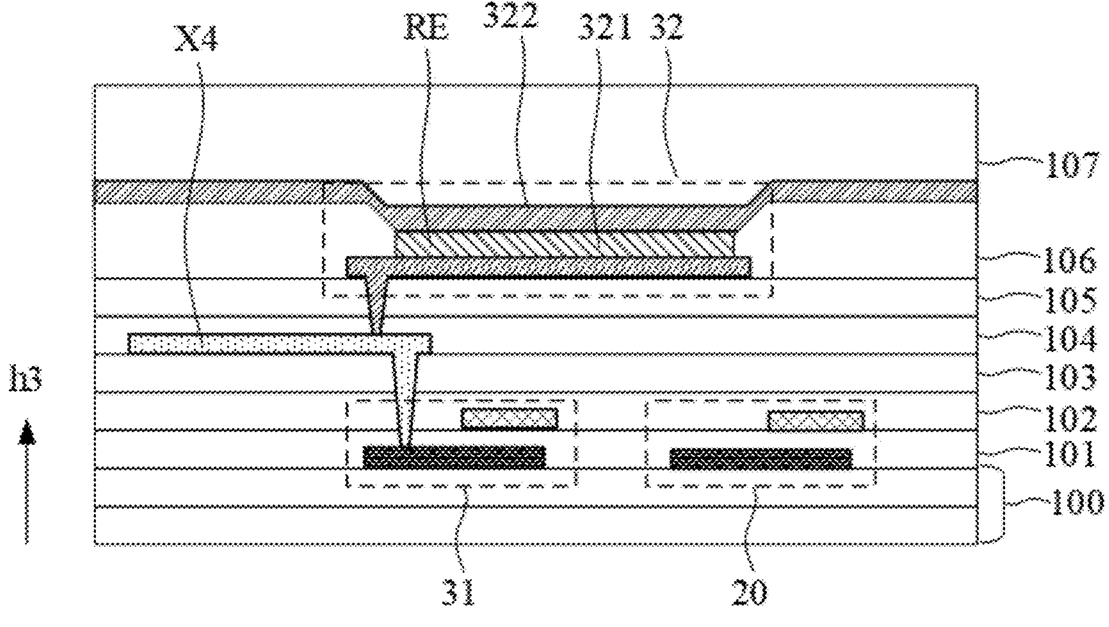
FIG. 29 illustrates a portion of a cross-sectional view of another exemplary display panel according to various disclosed embodiments of the present disclosure.
Figure 30:
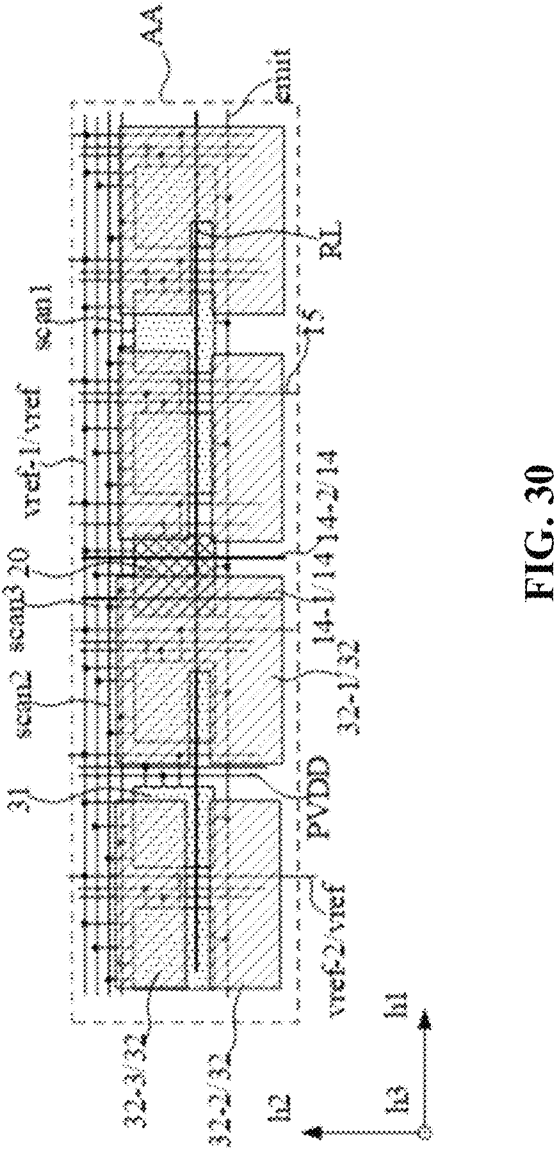
FIG. 30 illustrates a portion of another exemplary display panel according to various disclosed embodiments of the present disclosure.

In some embodiments, as shown in FIG. 29 and FIG. 30 (FIG. 30 simplifies the pixel driving circuit 31 and the repair driving circuit 20, and the specific structure of the circuit may be referred to FIG. 2), in the direction h3 perpendicular to the plane of the substrate 100, a repair driving circuit 20 located in the display area AA may at least partially overlap with at least one light-emitting element 32.

Because the repair driving circuit 20 may be located on the driving circuit layer and may not have a directly corresponding light-emitting element, the light-emitting element 32 provided above the repair driving circuit 20, as shown in FIG. 28, thereby increasing the aperture ratio of the display panel and improving the display performance of the display panel.

Specifically, as shown in FIG. 29, the display panel may also include a light-emitting material layer 321 and a cathode metal layer 322. After the light-emitting material layer 321 is in contact with the anode metal layer RE and the cathode metal layer 322, it may emit light through the current provided by the anode metal layer RE and the cathode metal layer 322. the light-emitting material layer 321, the anode metal layer RE and the cathode metal layer 322 together may constitute the light-emitting element 32. The display panel may also include a sixth insulation layer 106 and an encapsulation layer 107. The sixth insulation layer 106 may be located on the side of the anode metal layer RE away from the substrate 100. The sixth insulation layer 106 may be configured to define the light-emitting area of the pixel. The encapsulation layer 107 may be located on the side of the metal layer 322 away from the substrate 100.

In some embodiments, the sixth insulation layer 106 may include an organic insulation material, such as at least one of acrylic resin, epoxy resin, phenolic resin, polyamide resin, and polyimide resin, etc. In some embodiments, the sixth insulation layer 106 may include multiple organic layers. The encapsulation layer 107 may usually include at least one inorganic encapsulation layer and at least one organic layer, and when the encapsulation layer 107 includes multiple stacked encapsulation layers, and the encapsulation layer closest to the display film layer may be an inorganic encapsulation layer, which may be better achieve the barrier function to water and oxygen.

Specifically, as shown in FIG. 30, the display panel may include a first light-emitting element 32-1, a second light-emitting element 32-2, and a third light-emitting element 32-3. The first light-emitting element 32-1, the second light-emitting element 32-3 2 and the third light-emitting element 32-3 may be blue, green and red light-emitting elements respectively, and together may form a display pixel.

It should be noted that in FIG. 30, the pixel driving circuit 31 may also at least partially overlap with the light-emitting element 32 in the h3 direction, but the overlapping portion between the pixel driving circuit 31 and the light-emitting element 32 may not include the overlap portion between the pixel driving circuit 31 and the repair connection line RL (the fourth adapting structure (X4) shown in FIG. 2). Such a configuration may avoid the situation that the light-emitting element 32 in the pixel driving circuit 31 is not electrically connected to the repair connection line RL during the pixel repair.

Figure 31:
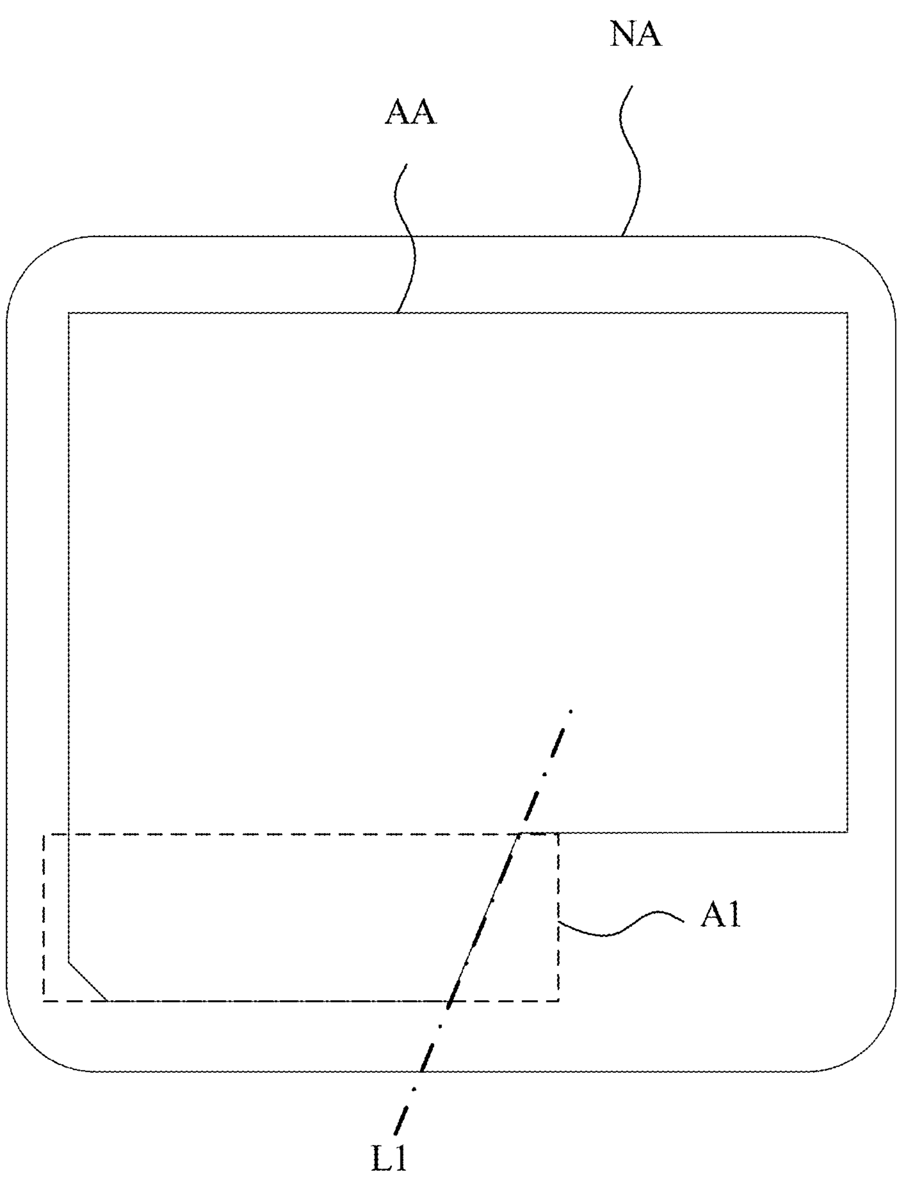
FIG. 31 illustrates an exemplary display panel according to various disclosed embodiments of the present disclosure.
Figure 32:
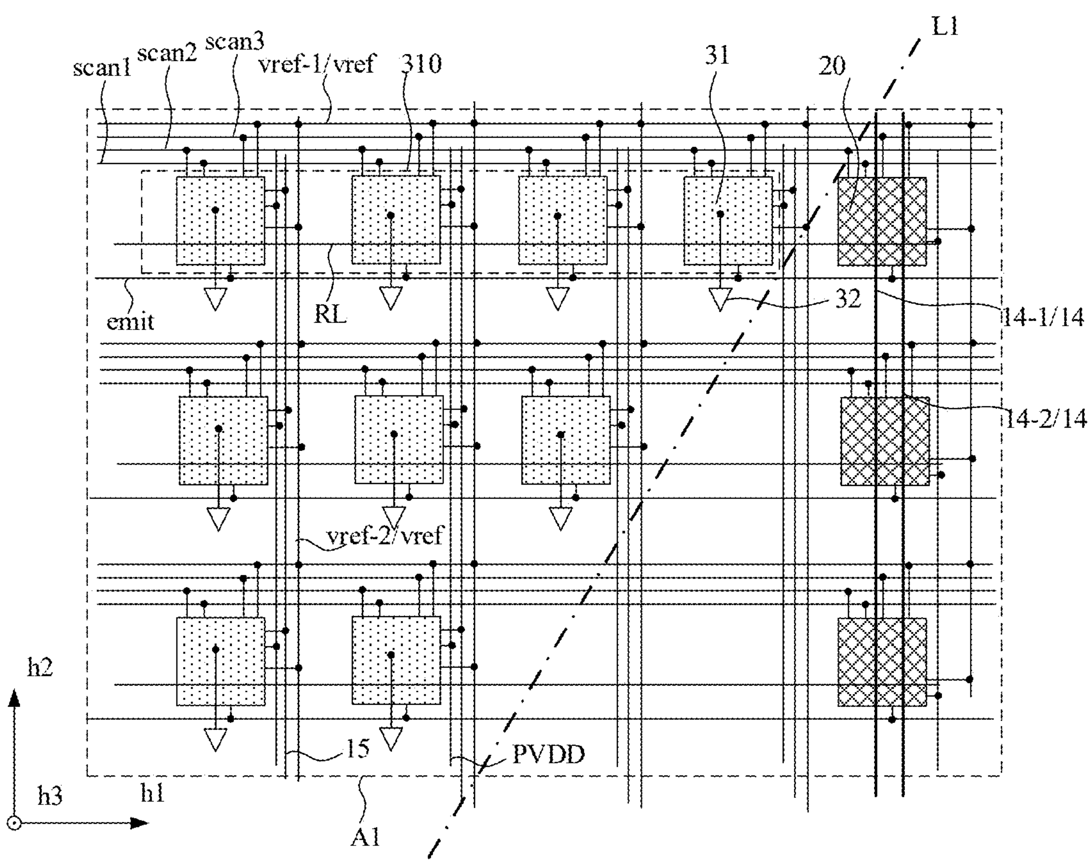
FIG. 32 illustrates a portion of another exemplary display panel according to various disclosed embodiments of the present disclosure.

In some embodiments, as shown in FIG. 31 and FIG. 32, the display panel may include a first area A1. In the first area A1, the quantities of the pixel driving circuits 31 of two adjacent pixel driving circuit rows 310 in the second direction h2 may not be equal. Specifically, the cut-off positions of the pixel driving circuit rows 310 may be different in the second direction h2. In the first area A1, the repair driving circuits 20 may at least partially overlap along the second h2.

To cooperate with other electronic components installed in the display panel, such as cameras, etc., there will be a special-shaped design in the actual display panel. The junction L1 of the display area and the non-display area of the special-shaped area (i.e. the above-mentioned first area A1) may be a diagonal line, reflected in the fact that the numbers of pixel driving circuits in two adjacent pixel driving circuit rows are not equal. However, the repair drive circuits in the special-shaped area may not need to be arranged adjacent to the rows of pixel drive circuits. The repair drive circuits in the special-shaped area may be arranged along the second direction h2 which is similar to the repair driving circuits in the regular area, thereby making the circuit wiring related to the repair driving circuit easier, especially in areas where multiple data repair lines run straight through the special-shape. Accordingly, the circuit routing may be simplified.

In some embodiments, along the direction h3 perpendicular to the plane of the substrate 100, the projected areas of the pixel driving circuit 31 and the repair driving circuit 20 may be same.

Specifically, when the repair driving circuit 20 and the pixel driving circuit 31 have the same circuit structure, they may be used to drive the light-emitting element 32 to emit light. At this time, the projected areas of the pixel driving circuit 31 and the repair driving circuit 20 may be same, which may facilitate the circuit layout in the driving circuit layer, and facilitate the production and manufacturing of display panels. Moreover, when the pixel driving circuit 31 is located in the display area AA, the repair driving circuit 20 and the pixel driving circuit 31 may have the same circuit structure such that the etching effect of the circuit in the display area AA may be more consistent, thereby improving the display uniformity of the display panel.

Figure 33:
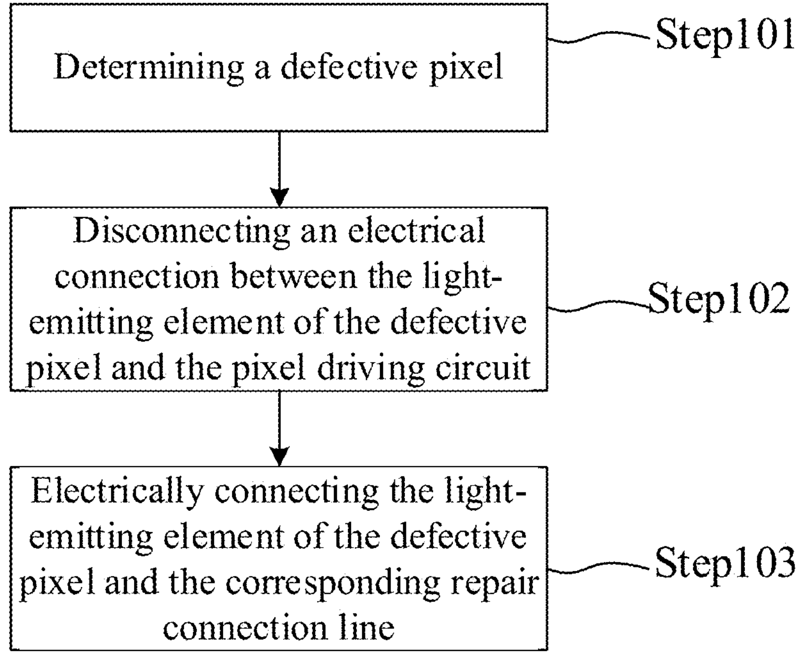
FIG. 33 illustrates a flow chart of an exemplary pixel repair method for a display panel according to various disclosed embodiments of the present disclosure.

The present disclosure also provides a pixel repair method for a display panel, FIG. 33 illustrates a flow chart of an exemplary pixel repair method according to various of the present disclosed embodiments. As shown in FIG. 33, the pixel repair method for the display panel may include:

Step 101: determining a defective pixel.

Specifically, the light-emitting element with an abnormal light emission may be first determined, and then the pixel corresponding to the light-emitting element may be determined as a defective pixel.

The pixel repair method may also include:

Step 102: disconnecting the electrical connection between the light-emitting element of the defective pixel and the pixel driving circuit.

Specifically, as shown in FIG. 14, when a pixel driving circuit 31-1 in the display panel fails, causing the light-emitting element 32-1 corresponding to the pixel driving circuit 31-1 to fail to emit light normally, then it may be necessary to use the repair connection line 14-1 corresponding to the pixel driving circuit 31-1 and the repair driving circuit 20-1 to drive the light-emitting element 32-1 to emit light. As shown in FIG. 14, when the pixel driving circuit 31-1 fails, the electrical connection between the light-emitting element 32-1 and the pixel driving circuit 31-1 may need to be disconnected. Specifically, as shown in FIG. 3, the electrical connection between the light-emitting element 32 and the second light-emitting control transistor T6 may need to be disconnected, and the electrical connection between the light-emitting element 32 and the second reset transistor T7 may be kept, thereby simplifying the process flow during pixel repair.

Further, the pixel repair method may include:

Step 103: electrically connecting the light-emitting element of the defective pixel to the corresponding repair connection line.

Specifically, as shown in FIG. 2, Step 103 may specifically include welding the overlap area between the repair connection line 14 and the fourth adapting structure X4 to connect. Because the fourth adapting structure X4 may be electrically connected to the anode RE of the light-emitting element 32, the repair connection line RL may be electrically connected to the anode RE of the light-emitting element 32 through the fourth adapting structure X4. The electrical connection between two components in the display panel may be implemented by a laser welding.

In one embodiment, the above method may further include:

Step 104: electrically connecting the light-emitting element of the defective pixel to the corresponding repair driving circuit and the corresponding repair connection line.

As shown in FIG. 2 and FIG. 14, when the repair driving circuit 20-1 participates in pixel repair, in addition to electrically connecting the light-emitting element 32-1 to the repair connection line RL, the repair driving circuit 20-1 may also need to be electrically connected to the repair connection line RL, that is, it may be also necessary to weld the second adapting structure X2 and the third adapting structure X3 at the overlap area with the repair connection line RL (in the embodiment where the second adapting structure X2 has been electrically connected to the repair connection line R, it may only need to weld the intersection of the third adapting structure X3 and the repair connection line RL).

Further, because the repair control transistor T8 may be used to prevent the reference voltage provided by the lateral reset voltage line vref-1 from being repeatedly written into the parasitic capacitor on the repair connection line RL in stages other than the light-emitting stage when the repair driving circuit 20 is not involved in pixel repair, that is, the eighth repair control transistor T8 may not participate in pixel repair. As shown in FIG. 15, after the first parasitic capacitor Q1 is welded into a wire, the eighth repair control transistor T8 may be short-circuited so that it may not participate in pixel repair.

Specifically, in the embodiments shown in FIG. 1 and FIG. 2, when each repair data line 14 corresponding to the repair driving circuit 20 overlaps with the repair driving circuit 20 in the h3 direction, the pixel repair method may further include:

Step 105: electrically connecting the repair driving circuit 20 to a repair data line 14 through the first adapting structure X1, specifically welding the overlap area between the repair data line 14 and the first adapting structure X1.

In some embodiments, as shown in FIGS. 17-19, the plurality of repair data lines may include a first repair data line 141 and a second repair data line 142, and the first adapting structure may include a first sub-connection portion X11 and a second sub-connection part X12 that are electrically connected. The repair driving circuit 20 may be electrically connected to a first repair data line 141 through the first sub-connection part X11, and in the direction h3 perpendicular to the plane of the substrate, the second sub-connection part X12 may at least partially overlap with a second repair data line 142. The pixel repair method may also include:

Step 201: determining the first defective pixel; and

Step 202: disconnecting the electrical connection between the first defective pixel and the corresponding pixel driving circuit, and electrically connecting the first defective pixel to the corresponding repair connection line such that the repair driving circuit corresponding to the first defective pixel may receive data signal provided by the first repair data line.

Because the repair driving circuit 20 may be connected to a first repair data line 141 in advance, when the first defective pixel (i.e., the above-mentioned first defective) occurs in the plurality of pixel driving circuits 31 corresponding to the plurality of repair driving circuits 20 arranged along the second direction h2, and when the repair driving circuit 20 participates in the repair of the first defective pixel, there may be no need to connect the repair data line to the repair driving circuit, which may simplify the circuit repair process.

Further, the pixel repair method may include:

Step 203: determining a second defective pixel;

Step 204: disconnecting the electrical connection between the second defective pixel and the corresponding pixel driving circuit, and electrically connecting the second defective pixel to the corresponding repair connection line;

Step 205: disconnecting the electrical connection between the repair driving circuit corresponding to the second defective pixel and the first repair data line; and Step 206: electrically connecting the repair driving circuit corresponding to the second defective pixel to a second repair data line such that the repair driving circuit corresponding to the second defective pixel receives the data signal provided by the second repair data line.

When a defective pixel appears again in the plurality of pixel driving circuits 31 corresponding to the plurality of repair driving circuits 20 arranged in the second direction h2, and the defective pixel may be located in a column different from the first defective pixel. Taking the defective pixel appears the second (that is, the above-mentioned second defective pixel) as an example, as shown in FIG. 20, the repair driving circuit 20-1 corresponding to the first defective pixel may have occupied the first repair data line 141, and the repair driving circuit 20-2 corresponding to the second defective pixel may need to be electrically disconnected from the first repair data line 141. Specifically, the electrical connection between the repair driving circuit 20-2 and the first repair data line 141 may be disconnected at the first sub-connection portion X11 shown in FIG. 18. Then, the repair driving circuit 20-2 corresponding to the second defective pixel may be electrically connected to the second repair data line 142. Specifically, the parasitic capacitor Q3 formed at the overlap area between the second sub-connection part X12 of the repair driving circuit 20-2 and the second repair data line 142 may be welded into a wire such that the repair driving circuit 20-2 may receive the data signal provided by the second repair data line 142 and may participate in the repair of the second defective pixel.

Specifically, the first adapting structure may also include a third sub-connection part X13 as shown in FIG. 21. The third sub-connection part X13 may be located in the second metal layer M2. One third sub-connection part X13 may be electrically connected to a second repair data line 142 and may overlap with the second sub-connection part X12 in the direction h3 perpendicular to the plane of the substrate such that the second repair data line 142 may be electrically connected to the second sub-connection part X12 through the third sub-connection part X13. The above Step 206 may specifically include electrically connecting the repair driving circuit 20 corresponding to the second defective pixel with a second repair data line 142 through the second sub-connection part X2 and the third sub-connection part X3 such that the driving circuit 20 corresponding the second defective pixel may receive the data signal provided by the second repair data line 142.

It should be noted that some embodiments of the present disclosure have been described above. Other embodiments are within the scope of the appended claims. In some cases, the actions or steps recited in the claims may be performed in a different order than in the above-described embodiments and still achieve the desired results. Additionally, the processes depicted in the figures do not necessarily require the specific order shown, or sequential order, to achieve desirable results. Multitasking and parallel processing are also possible or may be advantageous in certain implementations.

The present disclosure also provides a display device. The display device may include a display panel in any of the above embodiments.

Figure 34:
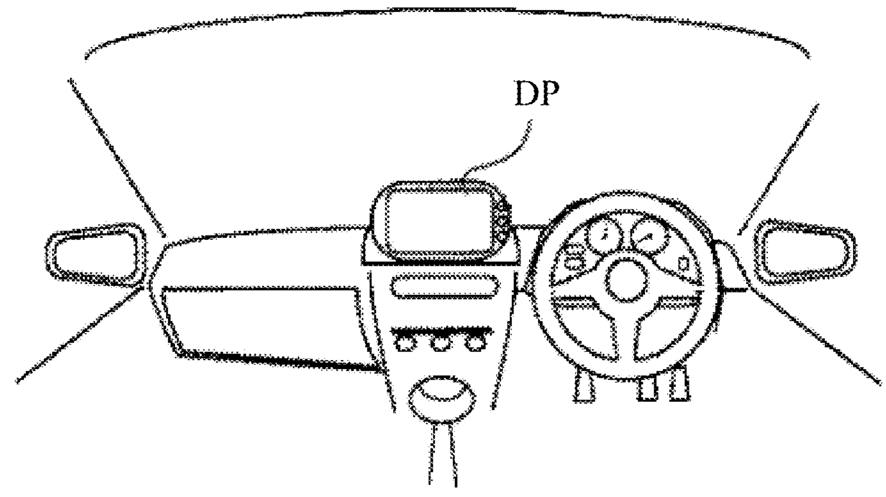
FIG. 34 illustrates an exemplary display device according to various disclosed embodiments of the present disclosure.

The display device may be, for example, a mobile phone, a tablet computer, a notebook computer, an electronic paper book, a television, a smart watch, or any other device with a display function. FIG. 34 is a schematic structural diagram of an exemplary display device according to various disclosed embodiments of the present disclosure. As shown in FIG. 34, the display device may include the display panel DP in any of the above embodiments. When the display panel is used as a carrier display screen in vehicles such as cars, ships or airplanes, it may be independent of the inherent structure in the vehicle, or it may be a local structure integrated with other structural components in the vehicle. For example, the display panel may be integrated with the front windshield, or may be integrated with the tabletop around the instrument panel, which is not limited in the embodiment of the present disclosure.

The display device provided by the present disclosure may set at least two repair data lines corresponding to one repair drive circuit such that when one of the repair data lines is occupied by other repair driving circuits, the other one or more repair driving lines may also send data to the other repair driving circuit. The circuit may independently provide data signals, thereby enabling the display panel to repair more defective pixels when the same number of repair driving circuits are installed, thereby improving the pixel fault tolerance rate of the display panel.

Specifically, the display device in the embodiment of the present disclosure may be a medium-sized display device such as a tablet computer, a notebook computer, or a vehicle-mounted display screen. Because the resolution of the medium-sized display device may be relatively high, for example, a display panel with a resolution of 3456×2160, which can be roughly understood that it includes 3456 pixel circuit driving rows, and each pixel circuit driving row includes 2160 pixel driving circuits. For a medium-sized display device, the probability of defective pixels in the display panel is also relatively high, the embodiments provided by the present disclosure may improve the pixel fault tolerance rate of the display panel. In addition, the display panel of the medium-sized display device can be provided with a larger frame area (i.e., non-display area). When the repair driving circuit is located in the frame area, more repair data lines may be set up, further improving the number of pixels repaired by the repair driving circuits; and the pixel error tolerance of the display panel may be enhanced.

The devices of the above embodiments include the corresponding display panel in any of the foregoing embodiments, and have the beneficial effects of the corresponding method embodiments, which will not be described again here.

It should be noted that in this article, relational terms such as "first" and "second" are only used to distinguish one entity or operation from another entity or operation, and do not necessarily require or imply there is such actual relationship or sequence between entities or operations. Furthermore, the terms "comprises", "includes", or any other variations thereof are intended to cover a non-exclusive inclusion such that a process, method, article, or apparatus that includes a list of elements includes not only those elements, but also those not expressly listed other elements, or elements inherent to the process, method, article or equipment. Without further limitation, an element defined by the statement "comprises a . . . " does not exclude the presence of additional identical elements in a process, method, article, or device that includes the foregoing element.

The above are only specific embodiments of the present disclosure, enabling those skilled in the art to understand or implement the present disclosure. Various modifications to these embodiments will be readily apparent to those skilled in the art, and the generic principles defined herein may be practiced in other embodiments without departing from the spirit or scope of the disclosure. Therefore, the present disclosure is not to be limited to the embodiments set forth herein but is to be accorded the widest scope consistent with the principles and novel features disclosed herein.

What is claimed is:

1. A display panel, comprising:

a substrate;

a display area and a non-display area at least partially surrounding the display area;

a plurality of light-emitting elements and a plurality of pixel driving circuit rows, wherein the display area includes the plurality of light-emitting elements and the plurality of pixel driving circuit rows, the plurality of pixel driving circuit rows include a plurality of pixel driving circuits arranged in a first direction; and one of the plurality of pixel driving circuits is electrically connected to at least one light-emitting element of the plurality of light-emitting elements;

a plurality of repair connection lines, a plurality of repair data lines and a plurality of repair driving circuits, wherein one of the plurality of pixel driving circuit rows is correspondingly provided with at least one of the plurality of repair driving circuits and at least one of the plurality of repair connection lines, in a direction perpendicular to a plane of the substrate, the pixel driving circuit row and the repair driving circuit at least partially overlap with a same repair connection line of the plurality of repair connection lines;

an active layer and a first adapting structure, wherein the first adapting structure is located on a side of the active layer away from the substrate, the repair driving circuit includes a data writing transistor, the data writing transistor includes a channel and a first electrode located in the active layer, and the first adapting structure is electrically connected to the first electrode of the data writing transistor; and a plurality of the repair driving circuits arranged in a second direction, wherein one repair driving circuit of the plurality of driving circuits is correspondingly provided with at least two repair data lines of the plurality of repair data lines, the second direction intersects the first direction, in the direction perpendicular to the plane of the substrate, the first adapting structure at least partially overlaps with two repair data lines of the plurality of repair data lines.

2. The display panel according to claim 1, further comprising:

a plurality of scan lines, wherein the pixel driving circuit row and the repair driving circuit at least partially overlap with at least a same scan line of the plurality of scan lines.

3. The display panel according to claim 1, wherein:

the plurality of repair data lines include a first repair data line and a second repair data line;

the first adapting structure includes a first sub-connection part and a second sub-connection part that are electrically connected;

the repair driving circuit is electrically connected to the first repair data through the first sub-connection part; and in the direction perpendicular to the plane of the substrate, the second sub-connection part at least partially overlaps with at least one second repair data line.

4. The display panel according to claim 3, wherein:

the first sub-connection part and the second sub-connection part are at least partially disposed in different layers.

5. The display panel according to claim 3, wherein:

the first repair data line is arranged in a layer different from at least one of the first sub-connection part and the second sub-connection part; and the second repair data line is arranged in a layer different from at least one of the first sub-connection part and the second sub-connection part.

6. The display panel according to claim 1, comprising:

a plurality of repair driving circuit groups arranged in the second direction;

each of the plurality of repair driving circuit groups includes at least one repair driving circuit;

repair driving circuits in a same repair driving circuit group of the plurality of repair driving circuit groups is electrically connected to a same repair data line of the plurality of repair data lines respectively through a corresponding first adapting structure; and repair driving circuits in different repair driving circuit groups of the plurality of repair driving circuit groups are electrically connected to different repair data lines of the plurality of repair data lines through corresponding first adapting structures.

7. The display panel according to claim 1, wherein the non-display area comprises:

the repair driving circuit and a dummy pixel driving circuit located on a side of the repair driving circuit away from the pixel driving circuit row.

8. The display panel according to claim 1, wherein:

the display area includes the repair driving circuit, and the non-display area includes a dummy pixel driving circuit.

9. The display panel according to claim 8, comprising:

a driving circuit layer located on one side of the substrate, wherein the driving circuit layer includes the plurality of pixel driving circuits, the plurality of repair driving circuits and the dummy pixel driving circuit, and the light-emitting element is located on a side of the driving circuit layer away from the substrate; and in the direction perpendicular to the plane of the substrate, one of the plurality of repair driving circuits located in the display area at least partially overlaps with at least one of the plurality of light-emitting elements.

10. The display panel according to claim 1, comprising:

a peripheral driving circuit, wherein each of the plurality of repair data lines at least partially overlaps with the peripheral driving circuit in the direction perpendicular to the plane of the substrate.

11. The display panel according to claim 10, wherein:

the non-display area includes the plurality of repair driving circuits and the peripheral driving circuit; and the peripheral driving circuit is located on a side of the plurality of repair driving circuits away from the pixel driving circuit row.

12. The display panel according to claim 1, comprising:

a first area, wherein in the first area, numbers of pixel driving circuits in two adjacent pixel driving circuit rows of the plurality of pixel driving circuit rows in the second direction are different; and in the first area, the plurality of repair driving circuits at least partially overlap in the second direction.

13. The display panel according to claim 1, wherein:

at least two repair data lines of the plurality of repair data lines are all located in a same layer.

14. The display panel according to claim 1, wherein:

in the direction perpendicular to the plane of the substrate, a projected area of a pixel driving circuit of the plurality of pixel driving circuits is same as a projected area of a repair driving circuit of the plurality of repair driving circuits.

15. The display penal according to claim 1, further comprising:

a light-emitting control line, a power supply voltage line, a first scan line, a second scan line, a third scan line, a first reset voltage line, and a second reset voltage line, wherein:

the repair driving circuit of the plurality of repair driving circuits also includes a driving transistor, a first reset transistor, a second reset transistor, a threshold compensation transistor, a first light-emitting control transistor, a second light-emitting control transistor and a first storage capacitor;

a first electrode of the first light-emitting control transistor is electrically connected to the power supply voltage line, a second electrode of the first light-emitting control transistor is electrically connected to a first electrode of the driving transistor, and a gate of the first light-emitting control transistor is electrically connected to the light-emitting control line;

a first electrode of the first reset transistor is electrically connected to the first reset voltage line, a second electrode of the first reset transistor is electrically connected to a gate electrode of the driving transistor, and a gate electrode of the first reset transistor is electrically connected to the first scan line;

a first electrode of the threshold compensation transistor is electrically connected to a second electrode of the driving transistor, a second electrode of the threshold compensation transistor is electrically connected to the gate electrode of the driving transistor, and a gate electrode of the threshold compensation transistor is electrically connected to the second scan line;

a second electrode of the data writing transistor is electrically connected to the first electrode of the driving transistor, and a gate electrode of the data writing transistor is electrically connected to the second scan line;

a second electrode of the first storage capacitor is electrically connected to the power supply voltage line, and a first electrode of the first storage capacitor is electrically connected to the gate of the driving transistor;

a first electrode of the second light-emitting control transistor is electrically connected to the second electrode of the driving transistor, a gate electrode of the second light-emitting control transistor is electrically connected to the light-emitting control line, a gate electrode of the second light-emitting control transistor is electrically connected to the light-emitting control line, a second electrode of the second light-emitting control transistor is located on the active layer and is electrically connected to a second adapting structure located on a side of the active layer away from the substrate, and in a direction perpendicular the plane of the substrate, the second adapting structure at least partially overlaps with the repair connection line; and a first electrode of the second reset transistor is electrically connected to the second reset voltage line, a gate electrode of the second reset transistor is electrically connected to the third scan line, a second electrode of the second reset transistor is located in the active layer and is electrically connected to a third adapting structure located on a side of the active layer away from the substrate, and in a direction perpendicular to the plane of the substrate, the third adapting structure at least partially overlaps with the repair connection line.

16. The display panel according to claim 15, wherein:

the first reset voltage line is electrically connected to the second reset voltage line; or the first reset voltage line is multiplexed as the second reset voltage line.

17. The display panel according to claim 15, wherein:

the second adapting structure is electrically connected to the repair connection line.

18. The display panel according to claim 15, wherein:

the repair driving circuit also includes a second storage capacitor, wherein a first electrode of the second storage capacitor is electrically connected to the power supply voltage line, a first electrode of the second reset transistor is electrically connected a reset voltage line, and a first electrode of the second storage capacitor is electrically connected to the power supply voltage line.

19. The display panel according to claim 15, wherein:

the repair driving circuit also includes a repair control transistor, wherein a first electrode of the repair control transistor is electrically connected to a second electrode of the second reset transistor, a second electrode of the repair control transistor is electrically connected to a second electrode of the second light-emitting control transistor and the repair connection line, and a gate electrode of the repair control transistor is electrically connected to the light-emitting control line.

20. A pixel repair method of a display panel, comprising:
providing a display panel,
wherein the display panel includes:
a substrate;
a display area and a non-display area at least partially surrounding the display area;
a plurality of light-emitting elements and a plurality of pixel driving circuit rows, wherein the display area includes the plurality of light-emitting elements and the plurality of pixel driving circuit rows, the plurality of pixel driving circuit rows include a plurality of pixel driving circuits arranged in a first direction; and one of the plurality of pixel driving circuits is electrically connected to at least one light-emitting element of the plurality of light-emitting elements;
a plurality of repair connection lines, a plurality of repair data lines and a plurality of repair driving circuits, wherein one of the plurality of pixel driving circuit rows is correspondingly provided with at least one of the plurality of repair driving circuits and at least one of the plurality of repair connection lines, in a direction perpendicular to a plane of the substrate, the pixel driving circuit row and the repair driving circuit at least partially overlap with a same repair connection line of the plurality of repair connection lines;
an active layer and a first adapting structure, wherein the first adapting structure is located on a side of the active layer away from the substrate, the repair driving circuit includes a data writing transistor, the data writing transistor includes a channel and a first electrode located in the active layer, and the first adapting structure is electrically connected to the first electrode of the data writing transistor; and
a plurality of the repair driving circuits arranged in a second direction, wherein one repair driving circuit of the plurality of driving circuits is correspondingly provided with at least two repair data lines of the plurality of repair data lines, the second direction intersects the first direction, in the direction perpendicular to the plane of the substrate, the first adapting structure at least partially overlaps with two repair data lines of the plurality of repair data lines;
determining a defective pixel;
disconnecting an electrical connection between a light-emitting element of the defective pixel and a corresponding pixel driving circuit; and
electrically connecting the light-emitting element of the defective pixel with a corresponding repair connection line.

21. The pixel repair method according to claim 20, wherein the plurality of repair data lines include a first repair data line and a second repair data line, the repair driving circuit is electrically connected to one first repair data line, and in a direction perpendicular to the plane of the substrate, the repair driving circuit at least partially overlaps with one second repair data lines, further comprising:
determining a first defective pixel and a second defective pixel;
disconnecting electrical connections between light-emitting elements of the first defective pixel and the second defective pixel and corresponding pixel driving circuits and electrically connecting all the light-emitting elements of the first defective pixel and the second defective pixel to the corresponding repair connection lines;
disconnecting an electrical connection between a repair driving circuit corresponding to the second defective pixel and the first repair data line; and
electrically connecting a repair driving circuit corresponding to the second defective pixel to a second repair data line such that the repair driving circuit corresponding to the first defective pixel receives the signal from the first repair data line and the repair driving circuit corresponding to the second defective pixel receives data signal provided by the second repair data line.

22. A display device, comprising:
a display panel,
wherein the display panel includes:
a substrate;
a display area and a non-display area at least partially surrounding the display area;
a plurality of light-emitting elements and a plurality of pixel driving circuit rows, wherein the display area includes the plurality of light-emitting elements and the plurality of pixel driving circuit rows, the plurality of pixel driving circuit rows include a plurality of pixel driving circuits arranged in a first direction; and one of the plurality of pixel driving circuits is electrically connected to at least one light-emitting element of the plurality of light-emitting elements;
a plurality of repair connection lines, a plurality of repair data lines and a plurality of repair driving circuits, wherein one of the plurality of pixel driving circuit rows is correspondingly provided with at least one of the plurality of repair driving circuits and at least one of the plurality of repair connection lines, in a direction perpendicular to a plane of the substrate, the pixel driving circuit row and the repair driving circuit at least partially overlap with a same repair connection line of the plurality of repair connection lines;
an active layer and a first adapting structure, wherein the first adapting structure is located on a side of the active layer away from the substrate, the repair driving circuit includes a data writing transistor, the data writing transistor includes a channel and a first electrode located in the active layer, and the first adapting structure is electrically connected to the first electrode of the data writing transistor; and
a plurality of the repair driving circuits arranged in a second direction, wherein one repair driving circuit of the plurality of driving circuits is correspondingly provided with at least two repair data lines of the plurality of repair data lines, the second direction intersects the first direction, in the direction perpendicular to the plane of the substrate, the first adapting structure at least partially overlaps with two repair data lines of the plurality of repair data lines.

* * * * *